US012641884B2

(12) United States Patent
Zhou et al.

(10) Patent No.: US 12,641,884 B2
(45) Date of Patent: May 26, 2026

(54) ARRAY SUBSTRATE, DISPLAY PANEL AND DISPLAY DEVICE

(71) Applicants: WUHAN TIANMA MICROELECTRONICS CO., LTD., Wuhan (CN); WUHAN TIANMA MICROELECTRONICS CO., LTD. SHANGHAI BRANCH, Shanghai (CN)

(72) Inventors: Xingyao Zhou, Shanghai (CN); Yana Gao, Shanghai (CN); Mengjia He, Shanghai (CN); Wei Liu, Shanghai (CN); Kang Yang, Shanghai (CN); Yuantao Wu, Shanghai (CN)

(73) Assignees: WUHAN TIANMA MICROELECTRONICS CO., LTD., Wuhan (CN); WUHAN TIANMA MICROELECTRONICS CO., LTD. SHANGHAI BRANCH, Shanghai (CN)

( * ) Notice: Subject to any disclaimer, the term of this patent is extended or adjusted under 35 U.S.C. 154(b) by 385 days.

(21) Appl. No.: 18/335,134

(22) Filed: Jun. 15, 2023

(65) Prior Publication Data

US 2023/0335564 A1      Oct. 19, 2023

(30) Foreign Application Priority Data

Mar. 21, 2023    (CN) ......................... 202310278263.8

(51) Int. Cl.
*H10D 86/60*        (2025.01)
*G09G 3/3233*        (2016.01)
*H10D 86/40*        (2025.01)

(52) U.S. Cl.
CPC ........... *H10D 86/60* (2025.01); *G09G 3/3233* (2013.01); *H10D 86/441* (2025.01);
(Continued)

(58) Field of Classification Search
CPC .... H10D 86/60; H10D 86/441; H10D 86/481; H10D 86/423; G09G 3/3233;
(Continued)

(56) References Cited

U.S. PATENT DOCUMENTS

| | | | |
|---|---|---|---|
| 10,714,008 B1 | 7/2020 | Lu | |
| 12,307,965 B2 * | 5/2025 | Zhang | .................. G09G 3/3233 |

(Continued)

FOREIGN PATENT DOCUMENTS

| | | |
|---|---|---|
| CN | 104200778 A | 12/2014 |
| CN | 108389549 A | 8/2018 |

(Continued)

OTHER PUBLICATIONS

The first office action and search report issued in Chinese corresponding application 202310278263.8, mailed on Mar. 17, 2026.

*Primary Examiner* — Tan N Tran

(74) *Attorney, Agent, or Firm* — KILPATRICK TOWNSEND & STOCKTON LLP

(57)      ABSTRACT

An array substrate, a display panel and a display device are provided. The array substrate includes: a substrate, a pixel circuit arranged on one side of the substrate and a body part. The pixel circuit includes a driving transistor and a threshold compensation transistor, a first electrode of the threshold compensation transistor is connected to a gate of the driving transistor, and a second electrode of the threshold compensation transistor and a first electrode of the driving transistor are both connected to a connection part. The body part is electrically connected to a power supply voltage signal end. An orthographic projection of the connection part on the substrate at least partially overlaps with an orthographic projection of the body part on the substrate.

19 Claims, 39 Drawing Sheets

(52) U.S. Cl.
  CPC .............. *G09G 2300/0819* (2013.01); *G09G 2300/0852* (2013.01); *G09G 2310/08* (2013.01); *G09G 2320/0233* (2013.01)

(58) Field of Classification Search
  CPC ... G09G 2300/0819; G09G 2300/0852; G09G 2310/08; G09G 2320/0233; G09G 2300/0426
  See application file for complete search history.

(56) References Cited

U.S. PATENT DOCUMENTS

| | | | |
|---|---|---|---|
| 12,406,622 B2 * | 9/2025 | Cong | .................... G09G 3/3233 |
| 2020/0286972 A1 * | 9/2020 | Seo | ......................... H10K 77/10 |
| 2021/0201778 A1 | 7/2021 | Kawachi | |
| 2022/0319417 A1 | 10/2022 | Liu et al. | |
| 2023/0316976 A1 | 10/2023 | Zhou et al. | |

FOREIGN PATENT DOCUMENTS

| | | | |
|---|---|---|---|
| CN | 113053304 A | 6/2021 |
| CN | 113990259 A | 1/2022 |
| CN | 114497159 A | 5/2022 |
| CN | 114586091 A | 6/2022 |
| CN | 114596814 A | 6/2022 |
| CN | 115311980 A | 11/2022 |

* cited by examiner

Time/ms

B-B

33/33h

32/c12

33/331

32/c12

200

200          1000

ARRAY SUBSTRATE, DISPLAY PANEL AND DISPLAY DEVICE

The present application claims priority to Chinese Patent Application No. 202310278263.8, titled "ARRAY SUBSTRATE, DISPLAY PANEL AND DISPLAY DEVICE", filed on Mar. 21, 2023 with the China National Intellectual Property Administration, which is incorporated herein by reference in its entirety.

FIELD

The present disclosure relates to the field of display technology, and in particular to an array substrate, a display panel, and a display device.

BACKGROUND

In the field of display technology, pixel circuits are formed in an array substrate to drive light-emitting elements to display. The pixel circuit includes a driving transistor. Gate potential of the driving transistor may affect driving currents generated by the driving transistors, to affect brightness of the light-emitting element.

However, in conventional technologies, gate potentials of the driving transistors in different pixel circuits are inconsistent, affecting display uniformity.

SUMMARY

Embodiments of the present disclosure provide an array substrate, a display panel, and a display device, which are beneficial for improving display uniformity.

In one embodiment, an array substrate is provided according to the embodiments of the present disclosure. The array substrate includes: a substrate, a pixel circuit arranged on one side of the substrate and a body part. The pixel circuit includes a driving transistor and a threshold compensation transistor, a first electrode of the threshold compensation transistor is connected to a gate of the driving transistor, and a second electrode of the threshold compensation transistor and a first electrode of the driving transistor are both connected to a connection part. The body part is electrically connected to a power supply voltage signal end. An orthographic projection of the connection part on the substrate at least partially overlaps with an orthographic projection of the body part on the substrate.

In some embodiments, a display panel is provided according to the embodiments of the present disclosure. The display panel includes the array substrate according to the embodiments.

In some embodiments, a display device is provided according to the embodiments of the present disclosure. The display device includes the display panel according to the embodiments.

BRIEF DESCRIPTION OF THE DRAWINGS

Other embodiments of the present disclosure become more apparent by reading the detailed description of non-limiting embodiments with reference to the accompanying drawings. The same or similar drawing marks represent the same or similar features, and the drawings are not drawn to the actual scale.

DETAILED DESCRIPTION OF EMBODIMENTS

Figure 1:
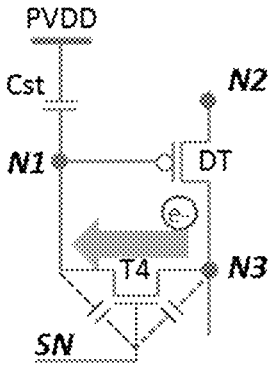
FIG. 1 shows a structural schematic diagram of a pixel circuit in the conventional technology.

Features and exemplary embodiments of the present disclosure are described in detail below. In order to make the purposes, embodiments of the present disclosure clearer, the present disclosure is further described in detail below in conjunction with the accompanying drawings and specific embodiments. It should be understood that the some embodiments described herein are only configured to explain the present disclosure and are not configured to limit the present disclosure. The following description of the embodiments is only to provide a better understanding of the present disclosure by showing examples of the present disclosure.

It should be noted that in this description, relational terms such as "first" and "second" are only used to distinguish one entity or operation from another entity or operation, and do not necessarily require or imply any actual relationship or order between the entities or operations. Moreover, terms such as "comprise", "include", or any other variation thereof are intended to cover non-exclusive inclusion, and a process, method, article, or device that includes a series of elements not only includes the series of elements, but also other elements not explicitly listed, or also includes elements inherent in such a process, method, article, or device. Without further limitations, an element limited by the statement "comprise . . ." does not exclude the existence of other identical element in the process, method, article, or device that includes the element.

It should be understood that when describing the structure of a component, in the case of a layer or region is described as being "on" or "over" another layer or region, it may indicate that the layer or region is directly on another layer or area, or other layers or regions are further included between the layer or region and another the layer or region.

In addition, if the component is flipped, the layer or region will be "below" or "beneath" another layer or region.

It should be understood that the term "and/or" herein is only a description of the association relationships of the associated objects, indicating that there may be three relationships, for example, A and/or B may represent three situations: A exists alone, A and B exist simultaneously, and B exists alone. In addition, the character "/" in this description generally indicates that a relationship of the pre and the post associated objects is an "or" relationship.

In the embodiments of the present disclosure, the terms "connect" and "electrically connect" indicate that two components are directly connected, or two components are connected via one or more other components.

The present disclosure intends to cover the modifications and changes of the present disclosure that fall within the scopes of the corresponding claims (claimed embodiments) and their equivalents. It should be noted that Implementations according to the embodiments of the present disclosure may be combined with each other without contradiction.

Before describing the embodiments of the present disclosure, the present disclosure describes problems existing in the conventional technologies to facilitate understanding of the embodiments of the present disclosure:

As shown in FIG. 1, in order to compensate the influence of a threshold voltage of a driving transistor DT on a driving current, a transistor T4 may be provided to compensate the threshold voltage of the driving transistor DT. A gate of the driving transistor DT is connected to a first node N1, one of a source and a drain of the driving transistor DT is connected to a second node N2, and the other of the source and the drain is connected to a third node N3. A gate of the transistor T4 is connected to a scanning line SN, a first electrode of the transistor T4 is connected to the third node N3, and a second electrode of the transistor T4 is connected to the first node N1. In addition, a storage capacitor Cst is connected between the first node N1 and the power supply end PVDD.

Figure 2:
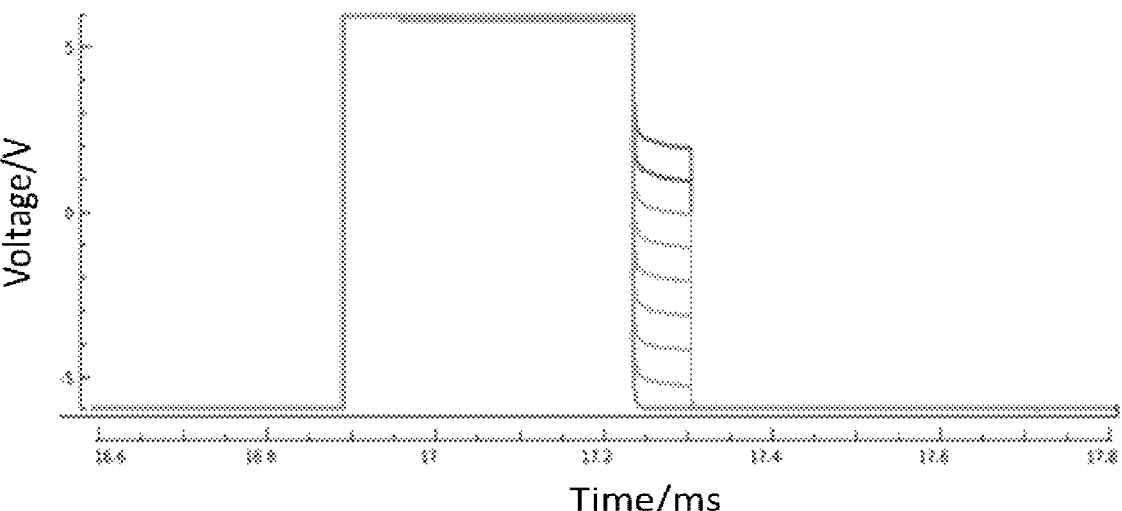
FIG. 2 shows a timing diagram of scanning signals.
Figure 3:
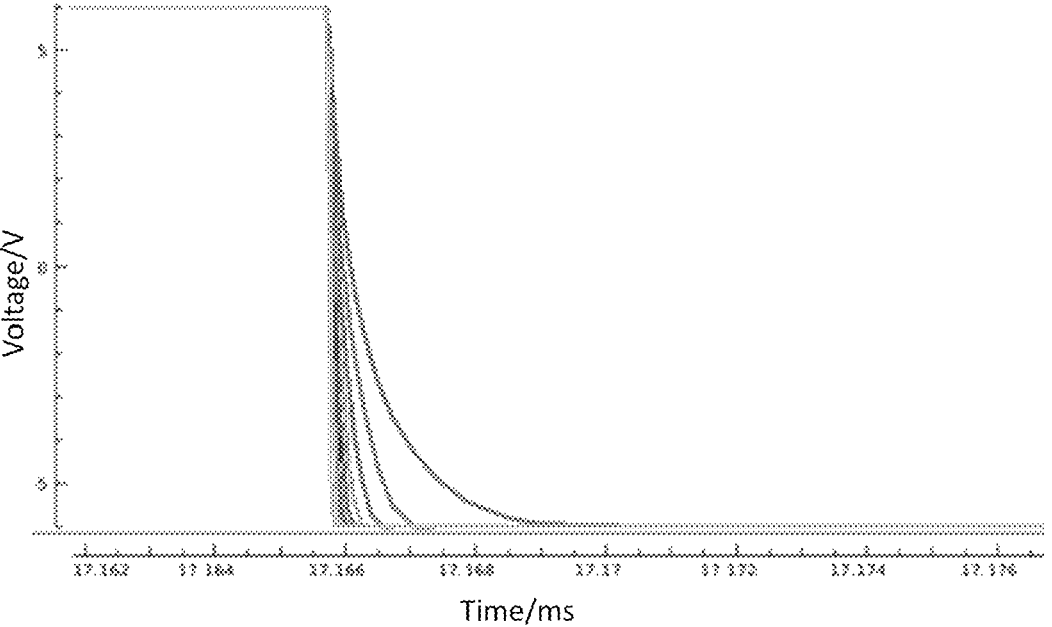
FIG. 3 shows another timing diagram of scanning signals.

To reduce a leakage current of the transistor T4, the transistor T4 may be an N-type transistor. In the case that the transistor T4 is an N-type transistor, the transistor T4 is turned on when a signal on the scanning line SN is at a high level, and the transistor T4 is cut off when the signal on the scanning line SN is at a low level. FIGS. 2 and 3 show timing schematic diagrams of the scanning signal. In FIGS. 2 and 3, a horizontal axis represents time and a vertical axis represents voltage. As shown in FIG. 2, when the signal on the scanning line SN jumps from a high level to a low level, the signal on the scanning line SN may have a step or no step. When the signals on different scanning lines SN jump from the high level to the low level, step heights of the signals on the scanning lines SN may be different. As shown in FIG. 3, when the signal on the scanning line SN jumps from a high level to a low level, the high level can smoothly transition to the low level. In this case, it can be considered that there is no step in the signal on the scanning line SN.

An array substrate may include a shift register. An output end of the shift register may be connected to the scanning line SN to transmit a scanning signal to the pixel circuit through the scanning line. The shift register may include a transistor, and the transistor in the shift register has a problem of threshold voltage shift (Vth shift).

Figure 4:
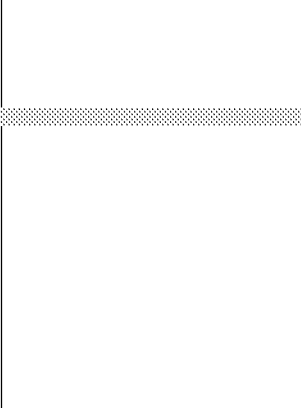
FIG. 4 shows a schematic diagram of a display effect of a display panel in the conventional technology.

No matter whether there are steps in the signals on the scanning lines SN, the signal jumping on the scanning lines SN leads to differences in potentials of the first nodes N1 in the pixel circuits connected to the scanning lines SN, resulting in a problem of lateral mura (uneven display) as shown in FIG. 4, and thus affecting display uniformity.

In-depth research on the causes of the above problems have been conducted and found that due to parasitic capacitances between the scanning lines SN and the first nodes N1 and between the scanning lines SN and the third nodes N3, the potentials of the first nodes N1 and the third nodes N3 are simultaneously coupled when the signals on the scanning lines SN jump from the high level to the low level. There are threshold voltage shifts of the transistors in the shift registers. There are scan signal delays or differences in the step heights of the signals on the scanning lines SN. The first nodes N1 are connected to the storage capacitors Cst. Under the coupling effect of the scanning lines SN, the potential changes of the first nodes N1 and the third nodes N3 are different, resulting in inconsistence of low charges written to the first nodes N1 by the third nodes N3 in different pixel circuits, thus leading to differences in the potentials of the first nodes N1 in different pixel circuits.

To solve the above problems, an array substrate, a display panel, and a display device are provided according to the embodiments of the present disclosure. The embodiments of the array substrate, the display panel and the display device are described below with reference to the accompanying drawings.

Figure 5:
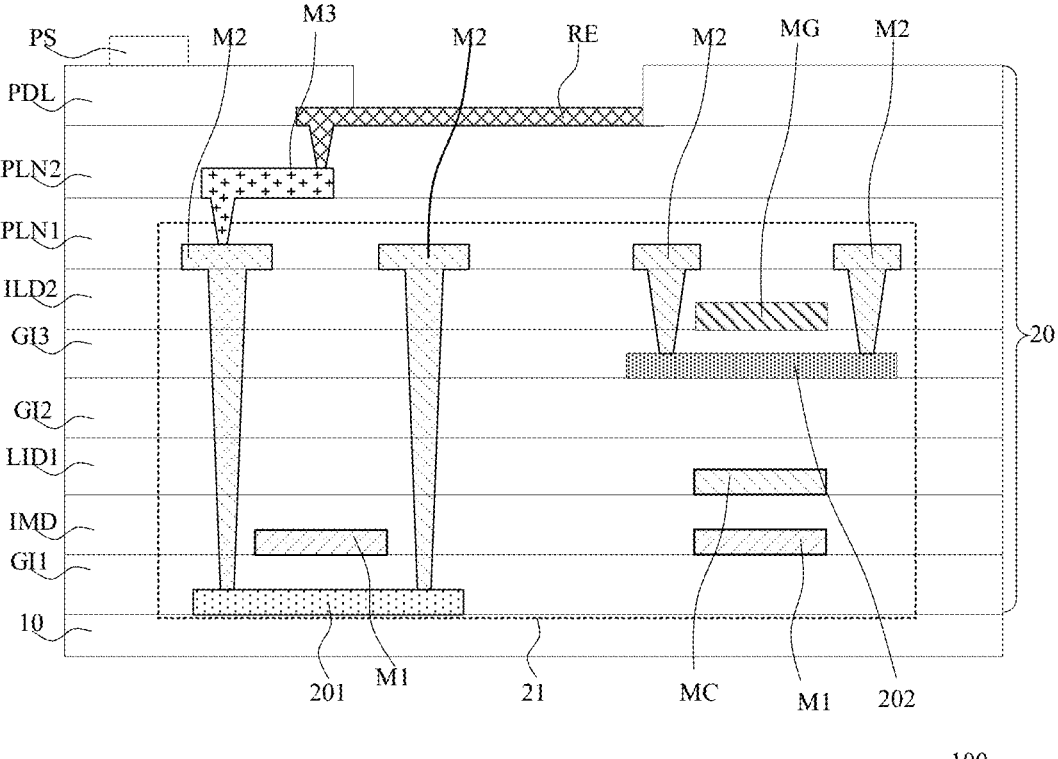
FIG. 5 shows a cross-section structural schematic diagram of an array substrate according to an embodiment of the present disclosure.

As shown in FIG. 5, the array substrate 100 may include a substrate 10 and a driving device layer 20 arranged on one side of the substrate 10. The driving device layer 20 may include at least one semiconductor layer and multiple conductive layers. The driving device layer 20 may include pixel circuits 21.

As an example, as shown in FIG. 5, in a thickness direction of the array substrate and in a direction far away from the substrate 10, the array substrate may include a first semiconductor layer 201, a first metal layer M1, a capacitor metal layer MC, a second semiconductor layer 202, a gate metal layer MG, a second metal layer M2, a third metal layer M3, and an anode layer RE that are stacked. An active layer of a P-type transistor may be formed in the first semiconductor layer 201, and an active layer of an N-type transistor may be formed in the second semiconductor layer 202. For example, the material of the first semiconductor layer 201 includes polysilicon (poly), and the material of the second semiconductor layer 202 includes indium gallium zinc oxide (IGZO). Insulation layers may be arranged between adjacent metal layers and between metal layers and semiconductor layers. For example, the insulation layers of the array substrate may include a first gate insulation layer GI1, a capacitor insulation layer IMD, a first interlayer dielectric layer ILD1, a second gate insulation layer GI2, a third gate insulation layer GI3, a second interlayer dielectric layer ILD2, a first planarization layer PLN1, and a second planarization layer PLN2. The array substrate may further include a pixel definition layer PDL and a support pillar PS.

Figure 6:
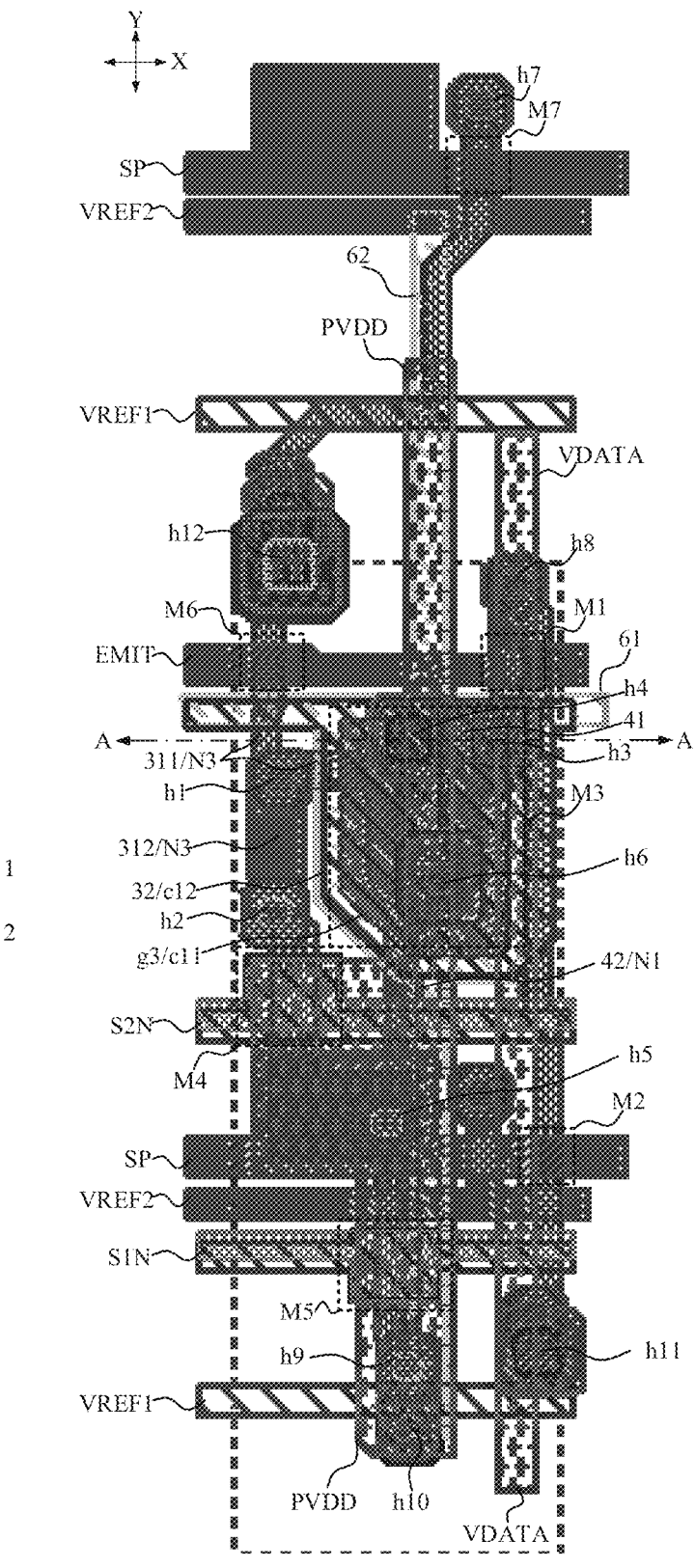
FIG. 6 shows a top view of a local layout of an array substrate according to an embodiment of the present disclosure.

As shown in FIG. 6, the pixel circuit 21 may include a driving transistor M3 and a threshold compensation transistor M4. The threshold compensation transistor M4 is configured to compensate the threshold voltage of the driving transistor M3. A first electrode of the threshold compensation transistor M4 is connected to the gate g3 of the driving transistor M3. The array substrate 100 may include a connection part 31, the connection part 31 is connected to a second electrode of the threshold compensation transistor M4, and the connection part 31 is connected to a first electrode of the driving transistor M3.

In order to show the layout structure of the pixel circuit, the substrate 10 is hidden in FIG. 6. The pixel circuit is arranged on one side of the substrate 10. In addition, in the accompanying drawings of the present disclosure, the structures with the same filling pattern are arranged in the same film layer.

Figure 7:
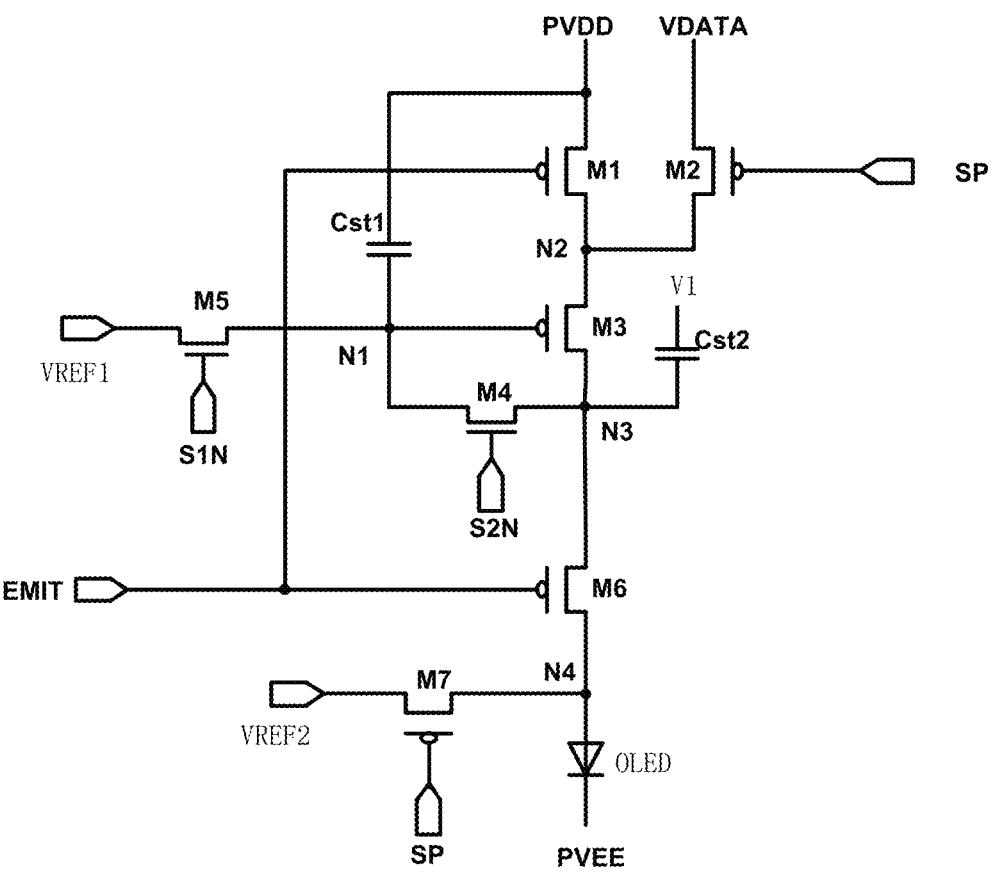
FIG. 7 shows a structural schematic diagram of an equivalent circuit of a pixel circuit in an array substrate according to an embodiment of the present disclosure.

As shown in FIG. 7, the first electrode of the driving transistor M3 may be electrically connected to a power wire PVDD, and the second electrode of the driving transistor M3 may be electrically connected to a light-emitting element OLED. For illustration, the accompanying drawings of the present disclosure show that the gate of the driving transistor M3 is connected to a first node N1, the first electrode of the driving transistor M3 is connected to a third node N3, the second electrode of the driving transistor M3 is connected to a second node N2, and the threshold compensation transistor M4 is connected between the first node N1 and the third node N3. It can be understood that the potential of the connection part 31 is the same as that of the third node N3, and the potential of the gate g3 of the driving transistor M3 is the same as that of the first node N1.

Figure 8:
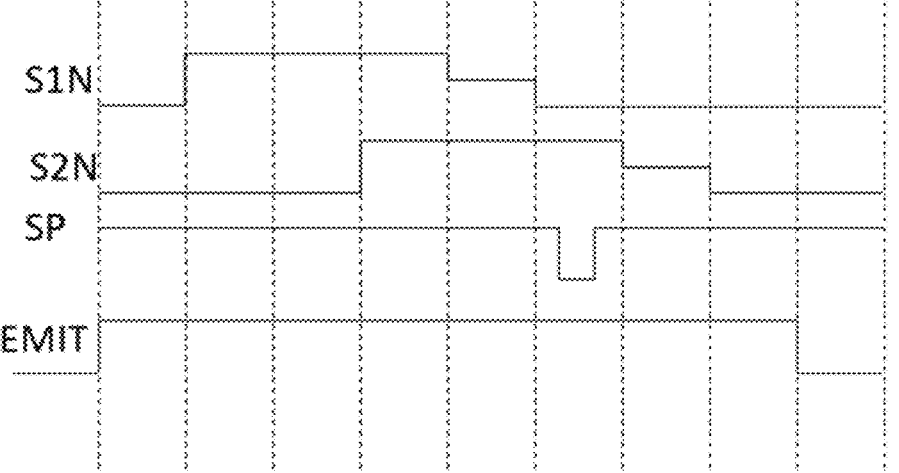
FIG. 8 shows a timing diagram of FIG. 7.

As shown in FIG. 7, the gate of the threshold compensation transistor M4 may be connected to the scanning line S2N. The threshold compensation transistor M4 may be an N-type transistor. As shown in FIG. 8, when the signal on the scanning line S2N jumps from a high level to a low level, the threshold compensation transistor M4 changes from an on state to an off state.

As shown in FIG. 6, the array substrate 100 includes a body part 32. The body part is electrically connected to a power supply voltage signal end (not shown in the figure). The power supply voltage signal end may be configured to provide a positive voltage signal or a negative voltage signal. An orthographic projection of the connection part 31 on the substrate 10 at least partially overlaps with an orthographic projection of the body part 32 on the substrate 10.

As shown in FIGS. 6 and 7, the part where the connection part 31 and the body part 32 are overlapped may form a second capacitor Cst2, and the second capacitor Cst2 is connected between the third node N3 and the power supply voltage signal end V1.

According to the array substrate provided by the embodiments of the present disclosure, the connection part 31 at least partially overlaps with the body part 32 to form the second capacitor Cst2 connected between the third node N3 and the power supply voltage signal end V1, which is equivalent to increase the storage capacitance connected to the third node N3, to reduce the voltage differences of the first nodes N1 and the third nodes N3 after coupling due to signal jumping on the scanning line S2N, and potential differences of the first nodes N1 in different pixel circuits caused by delays or differences of step heights of signals on scanning lines S2N become insensitive, to improve the consistency of potentials of the first nodes N1 in different pixel circuits, solving the problem of mura, and improving display uniformity. In addition, in the embodiments of the present disclosure, the connection part 31 is directly configured as an electrode plate of the second capacitor Cst2, without adding additional components as the electrode plate connected to the third node N3. In this way, an electrode plate of the second capacitor Cst2 is added without increasing the original space occupied by the pixel circuit, which not only improves display uniformity, but also improves PPI.

In order to describe the structure of each film layer in FIG. 6, FIGS. 6a to 6g respectively illustrate the structure of each film layer in FIG. 6. In the embodiment shown in FIG. 6, reference may be made to FIG. 6 and FIGS. 6a to 6g.

Figure 6A:
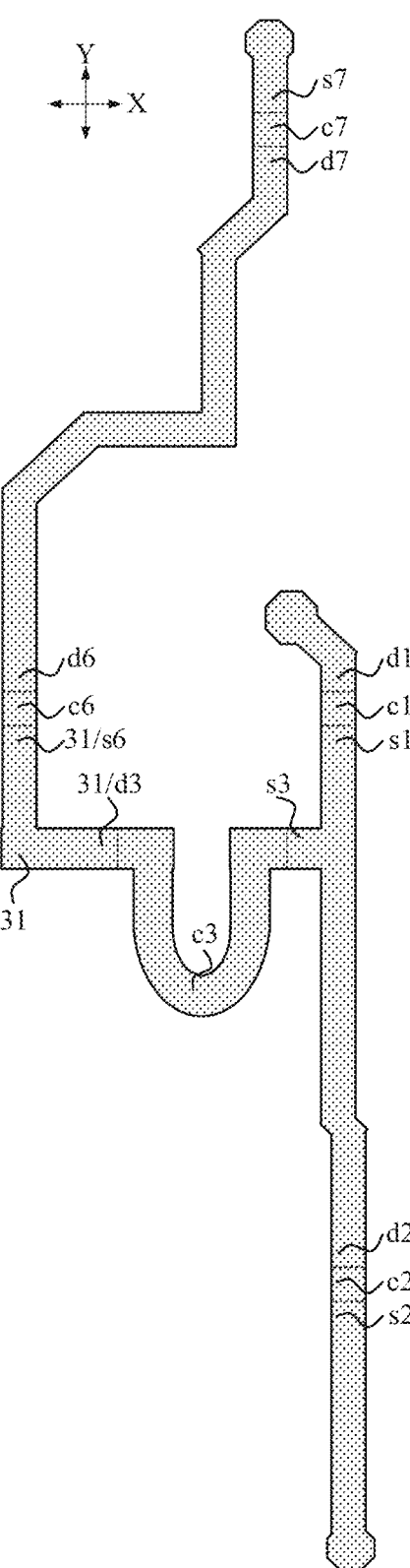
FIG. 6a shows a top view of a first semiconductor layer in FIG. 6.

As shown in FIG. 6a, the driving transistor M3, a data writing transistor M2, a second reset transistor M7, a transistor M6, and a transistor M1 in the pixel circuit may be polysilicon transistors. Active layers of the polysilicon transistors and a first connection part 311 may be in the first semiconductor layer, and the active layer of each transistor may include a channel, and an a source and a drain that are arranged on two sides of the channel. FIG. 6a exemplarily shows a channel c3, a source s3 and a drain d3 of the driving transistor M3, a channel c2, a source s2 and a drain d2 of the data writing transistor M2, a channel c1, a source s1 and a drain d1 of the transistor M1, a channel c6, a source s6 and a drain d6 of the transistor M6, as well as a channel c7, a source s7 and a drain d7 of the second reset transistor M7.

Figure 6B:
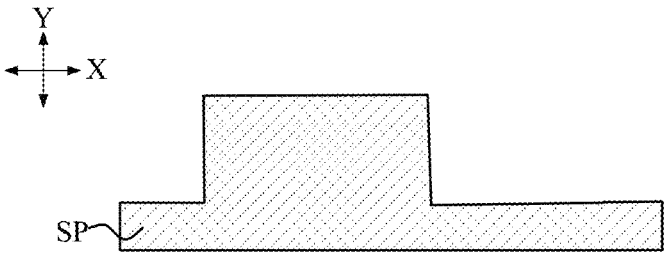
FIG. 6b shows a top view of a first metal layer in FIG. 6.
Figure 6B:
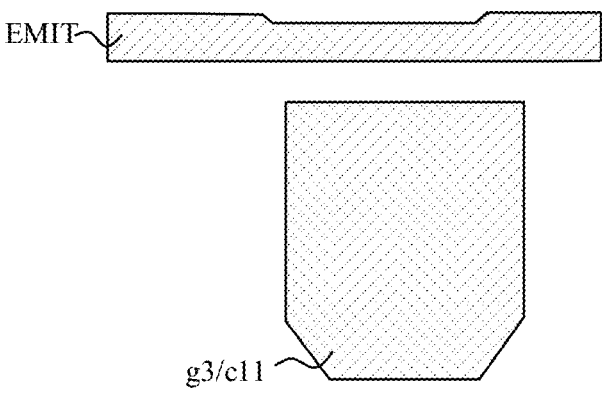
Figure 6B:
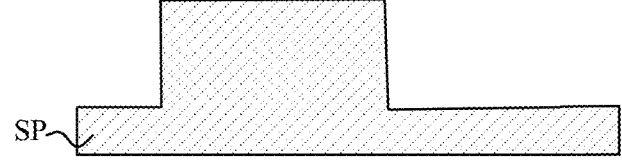

As shown in FIG. 6b, the gate g3 of the driving transistor, a scanning line SP, and a light-emitting control signal line EMIT may all be arranged in the first metal layer.

Figure 6C:
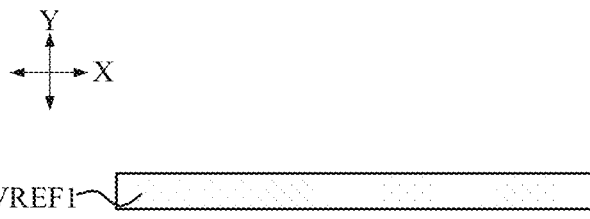
FIG. 6c shows a top view of a capacitor metal layer in FIG. 6.
Figure 6C:
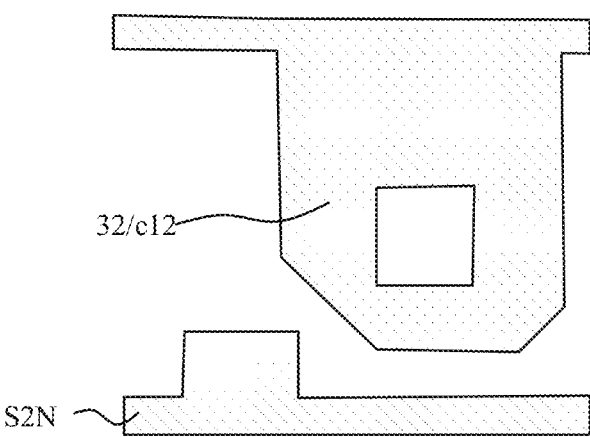
Figure 6C:
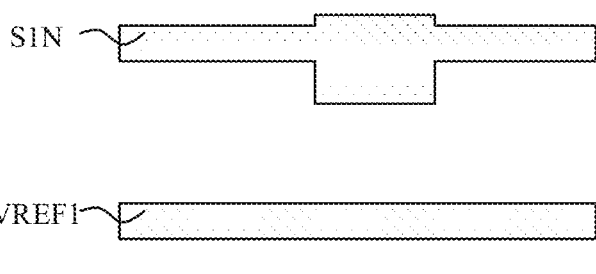

As shown in FIG. 6c, a first reset signal line VREF1 and a second electrode plate c12 of the first capacitor may be arranged in the capacitor metal layer. Scanning lines S1N and S2N may have double-layer structures, and one layer of the scanning lines S1N and S2N may be arranged in the capacitor metal layer.

Figure 6D:
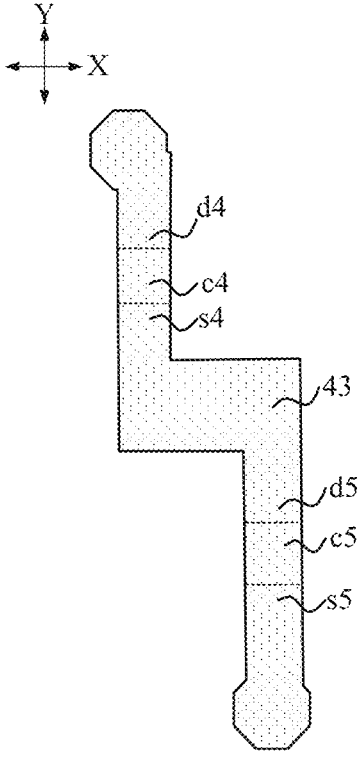
FIG. 6d shows a top view of a second semiconductor layer in FIG. 6.

As shown in FIG. 6d, the threshold compensation transistor M4 and a first reset transistor M5 in the pixel circuit may be oxide transistors, and active layers of the oxide transistors and a third connection part 43 may be arranged in the second semiconductor layer. FIG. 6d exemplarily shows a channel c4, a source s4 and a drain d4 of the threshold compensation transistor M4, as well as a channel c5, a source s5 and a drain d5 of the first reset transistor M5.

Figure 6E:
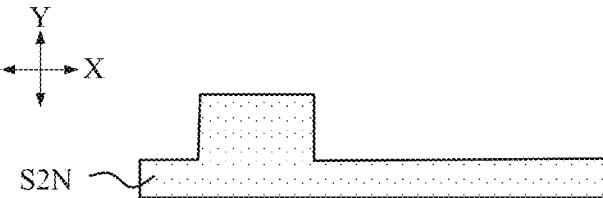
FIG. 6e shows a top view of a gate metal layer in FIG. 6.
Figure 6E:
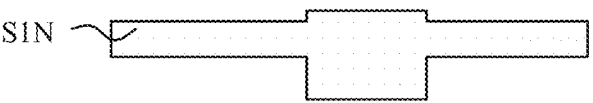

As shown in FIG. 6e, the other layer of the scanning lines S1N and S2N may be arranged in the gate metal layer.

Figure 6F:
FIG. 6f shows a top view of a second metal layer in FIG. 6.
Figure 6F:
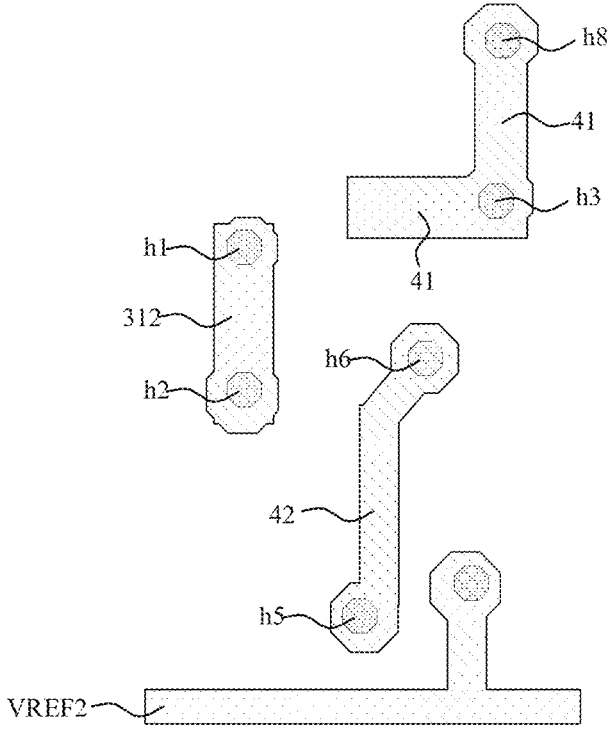
Figure 6F:
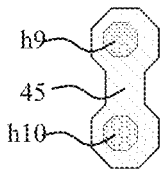

As shown in FIG. 6f, a second reset signal line VREF2, a second connection part 312, a first wiring part 41, a second wiring part 42, a fourth wiring part 44, and a fifth wiring part 45 may be arranged in the second metal layer.

The first wiring part 41 is connected to the second electrode plate c12 of the first capacitor C1 via a third through hole h3, and the first wiring part 41 is connected to the first electrode of the transistor M1 via an eighth through hole h8. The fifth wiring part 45 is connected to the first electrode of the first reset transistor M5 via a ninth through hole h9, and the fifth wiring part 45 is connected to the first reset signal line VREF1 via a tenth through hole h10.

Figure 6G:
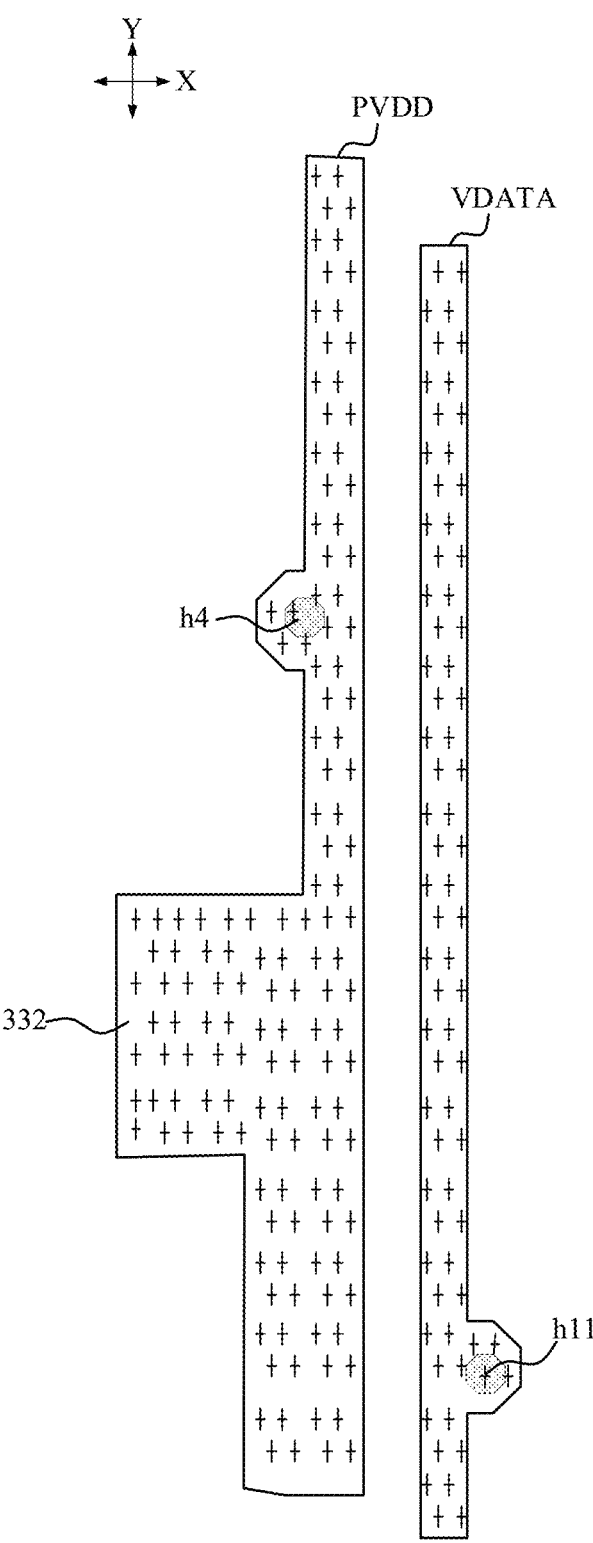
FIG. 6g shows a top view of a third metal layer in FIG. 6.

As shown in FIG. 6g, the power wire PVDD, a data line VDATA, and a second branch part 332 may be arranged in the third metal layer. The power wire PVDD may be connected to the first wiring part 41 via a fourth through hole h4, and the data line VDATA may be connected to the first electrode of the data writing transistor M2 via an eleventh through hole h11.

In addition, as shown in FIG. 6, the transistor M6 and the transistor M7 may be connected to the anode of the light-emitting element via a twelfth through hole h12.

Figure 9:
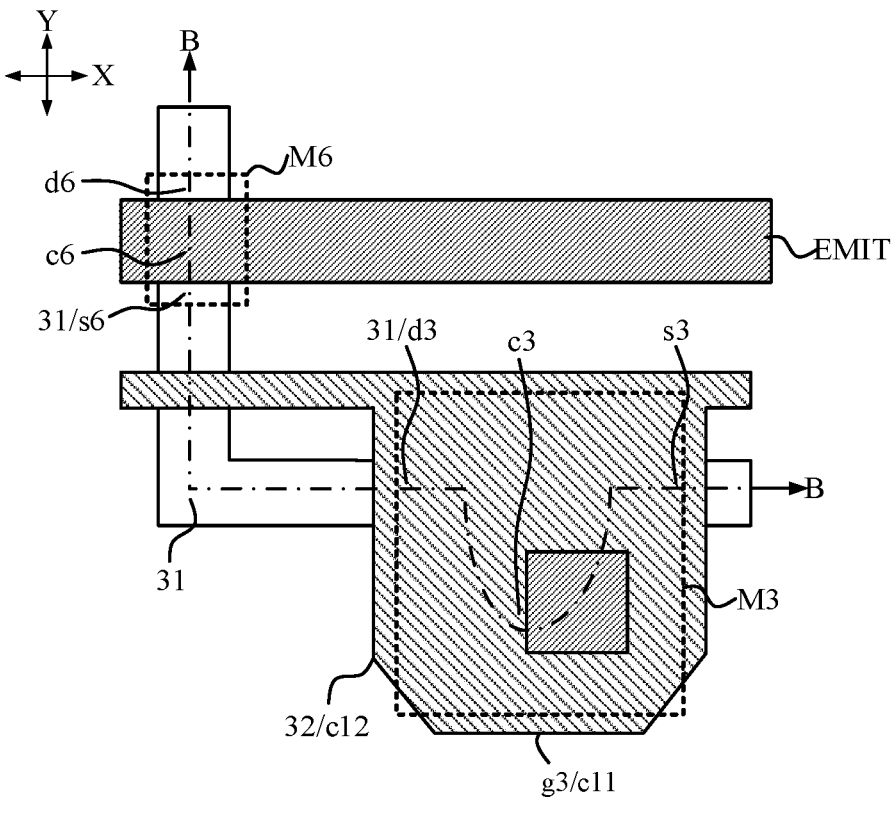
FIG. 9 shows a schematic diagram of a local structure of a pixel circuit in FIG. 6.
Figure 9A:
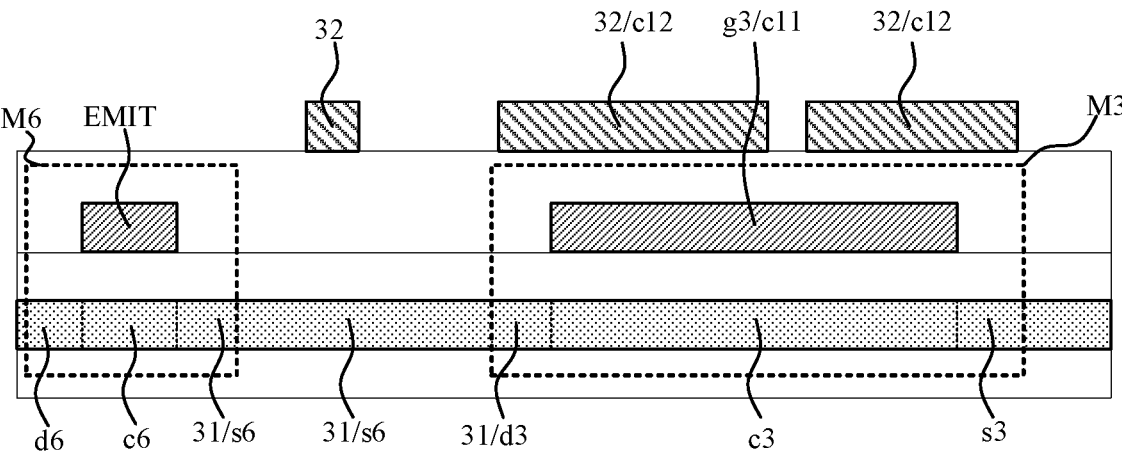
FIG. 9a shows a schematic diagram of a cross-sectional structure along B-B direction in FIG. 9.

FIGS. 9 and 9a show a driving transistor M3 as an example. The driving transistor M3 may include a gate g3, a channel c3, a source s3, and a drain d3. The materials of the channel c3, the source s3, and the drain d3 all include semiconductor materials. For example, the materials of the channel c3, the source s3, and the drain d3 include polysilicon (poly) materials. In a direction perpendicular to the plane where the array substrate is located, the channel c3 overlaps with the gate g3, while the source s3 and the drain d3 do not overlap with the gate g3. For example, the first electrode of the driving transistor M3 is the drain d3, and the drain d3 is connected to the connection part 31. For example, the connection part 31 may include the drain d3 and a part connected to the drain d3. In the direction perpendicular to the plane where the array substrate is located, the body part 32 at least partially overlaps with the connection part 31.

As shown in FIGS. 9 and 9a, the pixel circuit may further include a transistor M6, and a first electrode s6 of the transistor M6 is connected to the connection part 31. The first electrode s6 of the transistor M6 is connected to the first electrode d3 of driving transistor M3. The transistor M6 is controlled by the light-emitting control signal line EMIT. In a direction perpendicular to the plane where the array substrate is located, the first electrode s6 and a second electrode d6 of the transistor M6 do not overlap with the light-emitting control signal line EMIT, while a channel c6 of the transistor M6 overlaps with the light-emitting control signal line EMIT. For example, the connection part 31 may include the first electrode s6 of the transistor M6 and a part connected to the first electrode s6 of the transistor M6.

In some embodiments, as shown in FIG. 6, the pixel circuit may include a first capacitor Cst1, and the first capacitor Cst1 may include a first electrode plate c11 and a second electrode plate c12. The first electrode plate c11 is connected to the gate g3 of the driving transistor M3, and the second electrode plate c12 is connected to the first power wire PVDD. At least one of the second electrode plate c12 and the first power wire PVDD may be formed as the body part 32. In FIG. 6, the second electrode plate c12 of the first capacitor Cst1 is used as the body part 32 for illustration, which is not intended to limit the present disclosure.

In the embodiment of the present disclosure, in the direction perpendicular to the plane where the array substrate is located, for example, the second electrode plate c32 of the first capacitor Cst1 at least partially overlaps with the connection part 31, and the second electrode plate c32 of the first capacitor Cst1 may be directly used as the other electrode plate of the second capacitor Cst2, without adding additional components to form the other electrode plate of the second capacitor Cst2. In this way, the other electrode plate of the second capacitor Cst2 is added without increasing the original space occupied by the pixel circuit, and is helpful to improve PPI.

The first power wire PVDD may be configured to transmit a positive voltage signal. As shown in FIG. 7, the array substrate may further include a second power wire PVEE, and the second power wire PVEE may be connected to the cathode of the light-emitting element OLED. The second power wire PVEE may be configured to transmit a negative voltage signal.

Figure 6H:
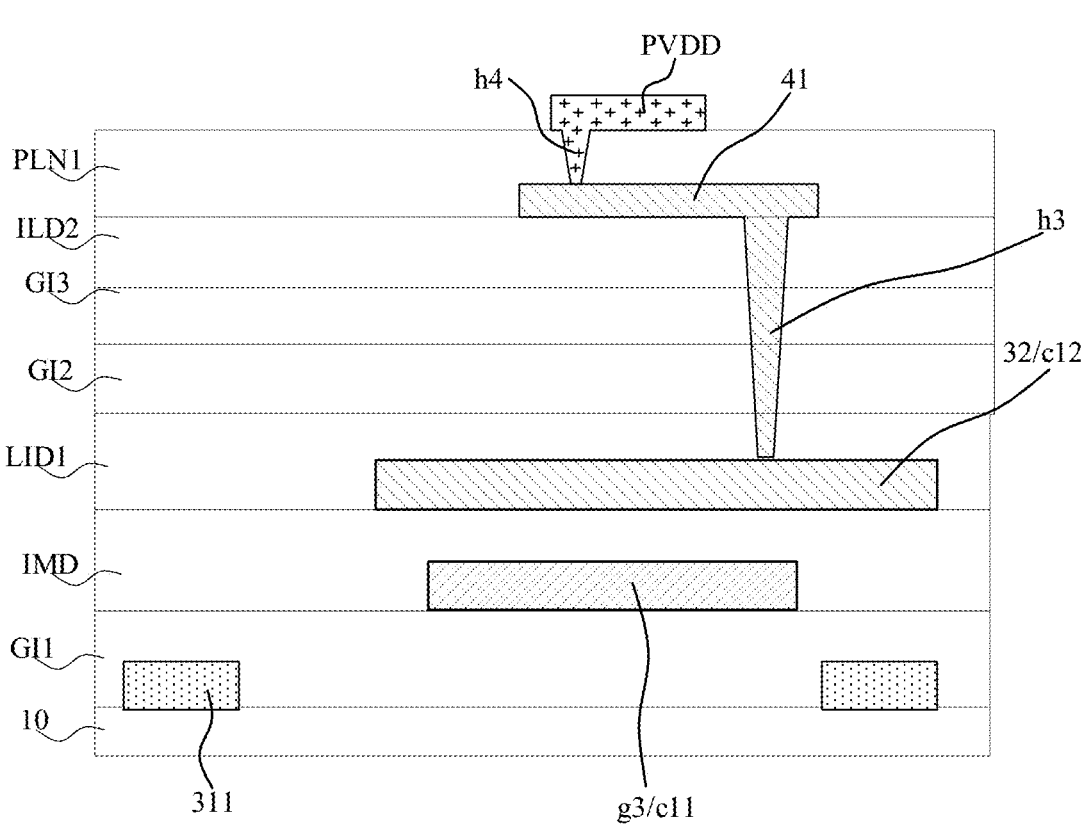
FIG. 6h shows a schematic diagram of a cross-section structure along A-A direction in FIG. 6.

In an embodiment, the second electrode plate c32 and the first power wire PVDD may be arranged in different film layers. As shown in FIGS. 6 and 6h, the array substrate may include a first wiring part 41, a third through hole h3, and a fourth through hole h4. The second electrode plate c12 of the first capacitor Cst1 is connected to the third through hole h3, one end of the first wiring part 41 is connected to the third through hole h3, the other end of the first wiring part 41 is connected to the fourth through hole h4, and the first power wire PVDD is connected to the fourth through hole h4, to achieve the connection between the second electrode plate c12 and the first power wire PVDD.

In some embodiments, the driving transistor M3 may be a P-type transistor, and the semiconductor materials of driving transistor M3 may include polysilicon (poly). The threshold compensation transistor M4 may be an N-type transistor, and the semiconductor materials of the threshold compensation transistor M4 may include indium gallium zinc oxide (IGZO). In one embodiment, the semiconductor materials of the threshold compensation transistor M4 may include at least one of materials such as indium zinc tin oxide (IZTO), zinc tin oxide (ZTO), indium tin oxide (ITO), and the like.

In one embodiment, for transistors including polysilicon (poly), hydrogenation treatment is required during the manufacturing process of the transistors, and hydrogen (H) can damage the semiconductor structure of IGZO. If the threshold compensation transistor M4 including IGZO is directly connected to polysilicon (poly), the performance of the threshold compensation transistor M4 is affected. Metal parts are required to realize electrical connection between the threshold compensation transistor M4 and polysilicon (poly). In addition, compared to semiconductor materials, metal materials have good conductivities.

Based on the above findings, as shown in FIG. 6, the connection part 31 may include a first connection part 311 and a second connection part 312, the first connection part 311 is connected to the first electrode of the driving transistor M3 and the second connection part 312, and the second connection part 312 is connected to the first electrode of the threshold compensation transistor M4. The first connection part 311 may be arranged in a same film layer as the first electrode of the driving transistor M3, and the first connection part 311 and the second connection part 312 are arranged in different film layers. In this way, damage to the threshold compensation transistor M4 during the hydrogenation process can be avoided, and it is beneficial for improving the overall conductivity of the connection part 31.

The materials of the first connection part 311 may include a semiconductor material. For example, the semiconductor material of the first connection part 311 and the driving transistor M3 is polysilicon. The materials of the second connection part 312 may include metal.

Figure 10:
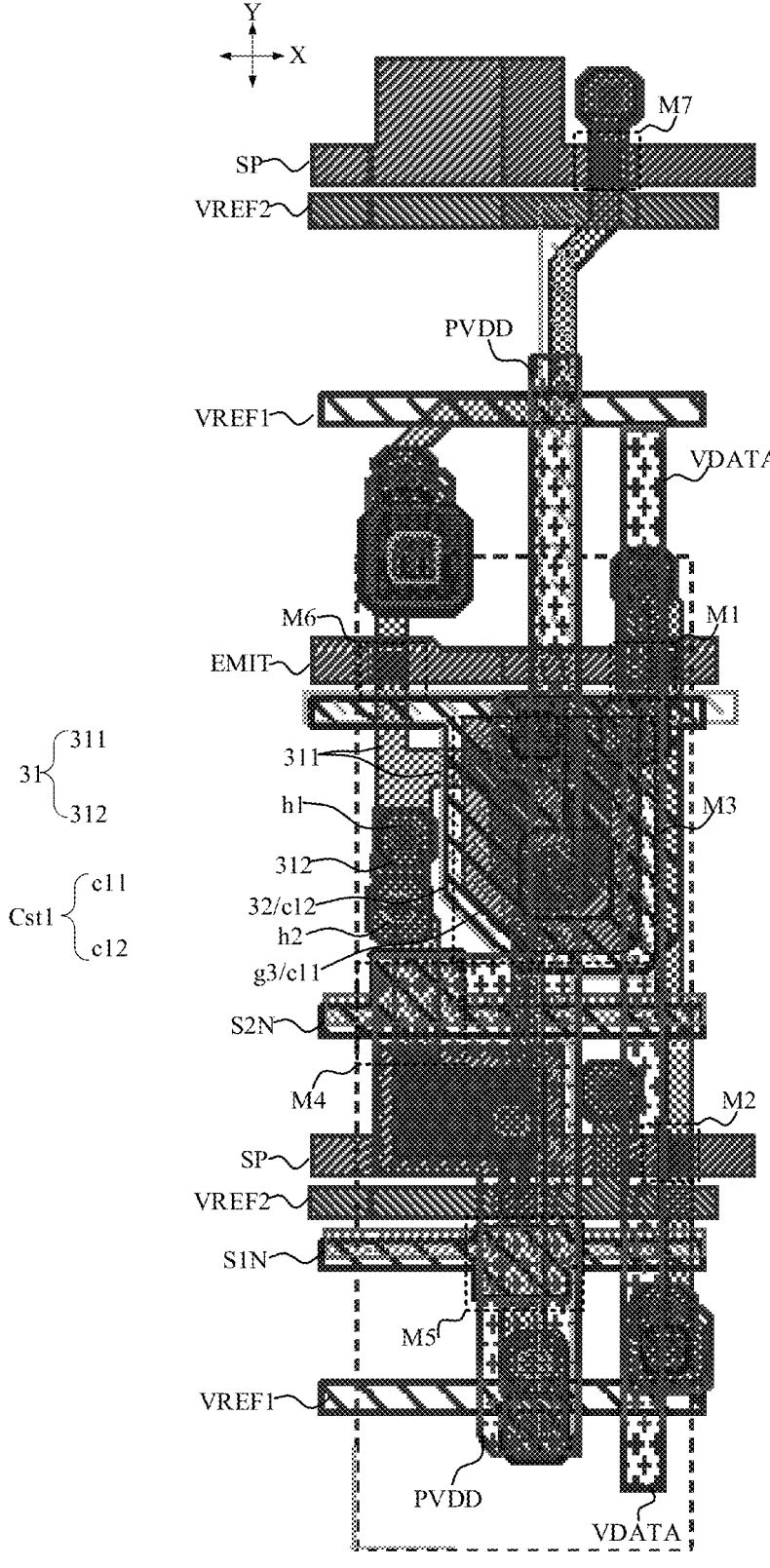
FIG. 10 shows another top view of a local layout of an array substrate according to an embodiment of the present disclosure.

As shown in FIG. 10, the first connection part 311 may include a part extending in a first direction Y, which is connected to the second connection part 312 and may also be connected to the first electrode of the transistor M6. The first connection part 311 may further include a part extending in a second direction X, which is connected to the first electrode of the driving transistor M3. The second connection part 312 may extend in the first direction Y. The first direction Y intersects the second direction X. For example, the first direction Y may be a column direction, and the second direction X may be a row direction.

The first connection part 311 may be connected to the second connection part 312 via a first through hole h1. The second connection part 312 and the first electrode of the threshold compensation transistor M4 may be arranged in different film layers. For example, the second connection part 312 may be connected to the first electrode of the threshold compensation transistor M4 via a second through hole h2.

In an embodiment, as shown in FIG. 5, the gates of the transistors and the signal lines connected to the gates of the transistors may be arranged in the first metal layer M11 or the gate metal layer MG Compared to the second metal layer M12 and the third metal layer M13, the capacitor metal layer MC has a shorter distance from the first semiconductor layer 201 in a thickness direction of the array substrate. In the thickness direction of the array substrate, a distance between the capacitor metal layer MC and the first semiconductor layer 201 is smaller than a distance between the capacitor metal layer MC and the second metal layer M12.

In the embodiment of the present disclosure, the thickness direction of the array substrate is perpendicular to the plane where the array substrate is located, or the thickness direction of the array substrate is the direction in which the film layers in the array substrate are stacked.

In an embodiment, the second electrode plate c12 of the first capacitor Cst1 may be arranged in the capacitor metal layer MC, the first connection part 311 may be arranged in the first semiconductor layer 201, and the second connection part 312 may be arranged in the second metal layer M12. The second electrode plate c12 of the first capacitor Cst1 may be configured as the body part 32. In the thickness direction of the array substrate, a distance between the body part 32 and the first connection part 311 may be smaller than a distance between the body part 32 and the second connection part 312.

Figure 10A:
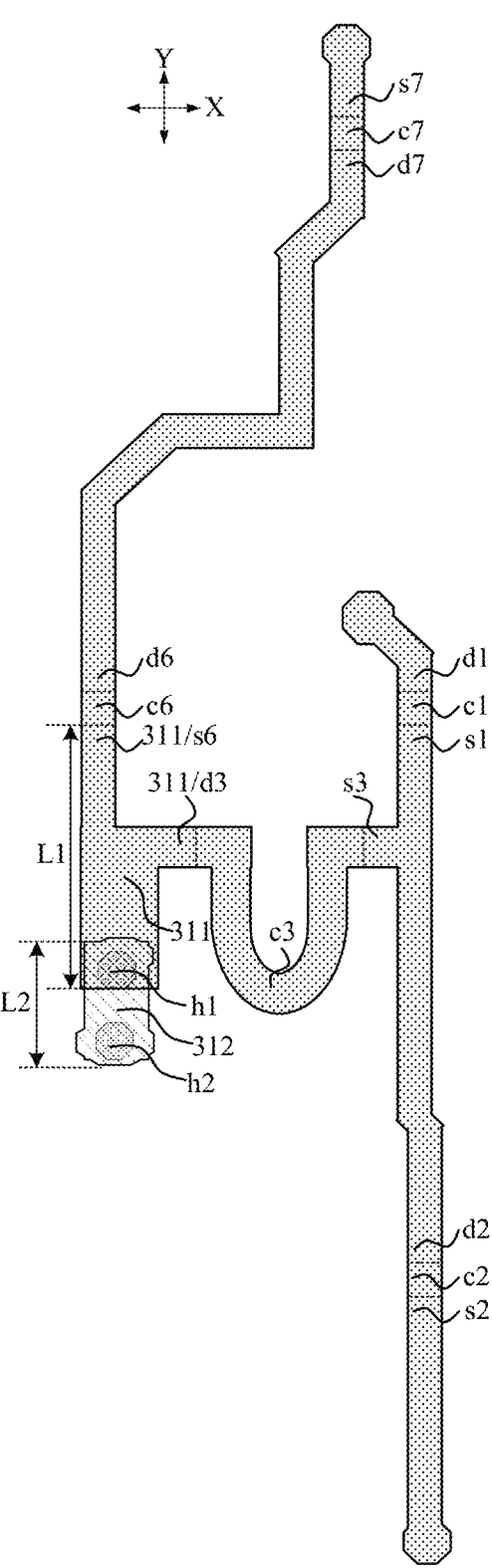
FIG. 10a shows a schematic diagram of a local structure of a pixel circuit in FIG. 10.

As shown in FIG. 10a, a length L1 of the first connection part 311 in the first direction Y may be greater than or equal to a length L2 of the second connection part 312 in the first direction Y, or in the first direction Y, a distance between the first through hole h1 and the first electrode of the driving transistor M3 may be greater than a distance between the first through hole h1 and the second through hole h2. In this way, the length of the first connection part 311 in the first direction Y is increased to increase the lateral overlapping area between the first connection part 311 and the body part 32. In the thickness direction of the array substrate, the distance between the first connection part 311 and the body part 32 may be small, to increase the capacitance of the second capacitor Cst2 formed by the connection part 31 and the body part 32 without increasing the overall size of the pixel circuit, to reduce the voltage differences of the first nodes N1 and the third nodes N3 after the coupling due to signal jumping on the scanning line S2N.

It should be noted that the difference between FIG. 10 and FIG. 6 is that compared to FIG. 6, in FIG. 10 the length of the first connection part 311 in the first direction Y is increased and the position of the first through hole h1 is closer to the position of the scanning line S2N. In FIG. 10, except for the length of the first connection part 311, the position of the first through hole h1 and the length of the second connection part 312, other structures may be the same as those shown in FIG. 6 and FIGS. 6a to 6g, and are not repeated here.

Figure 11:
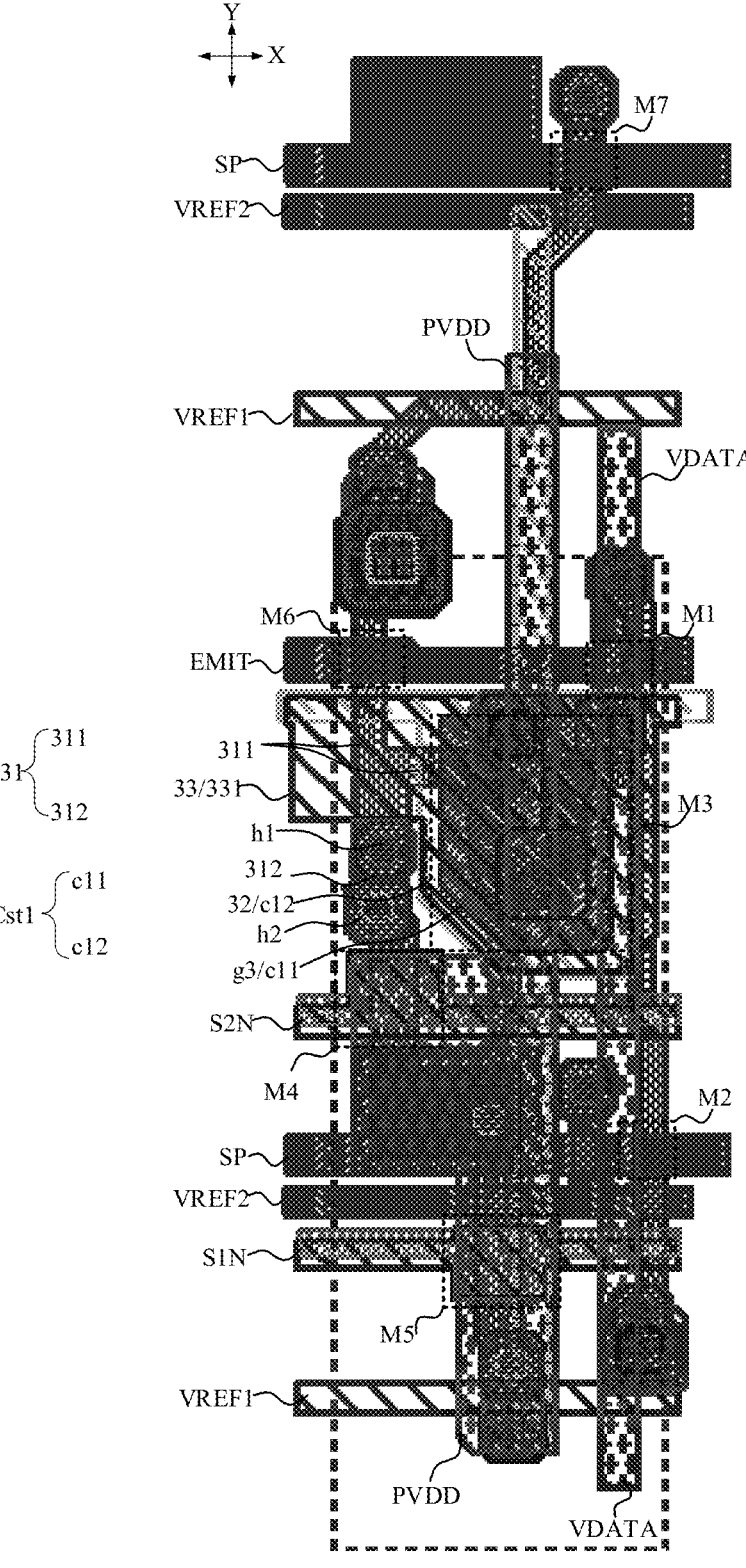
FIG. 11 shows another top view of a local layout of an array substrate according to an embodiment of the present disclosure.
Figure 11A:
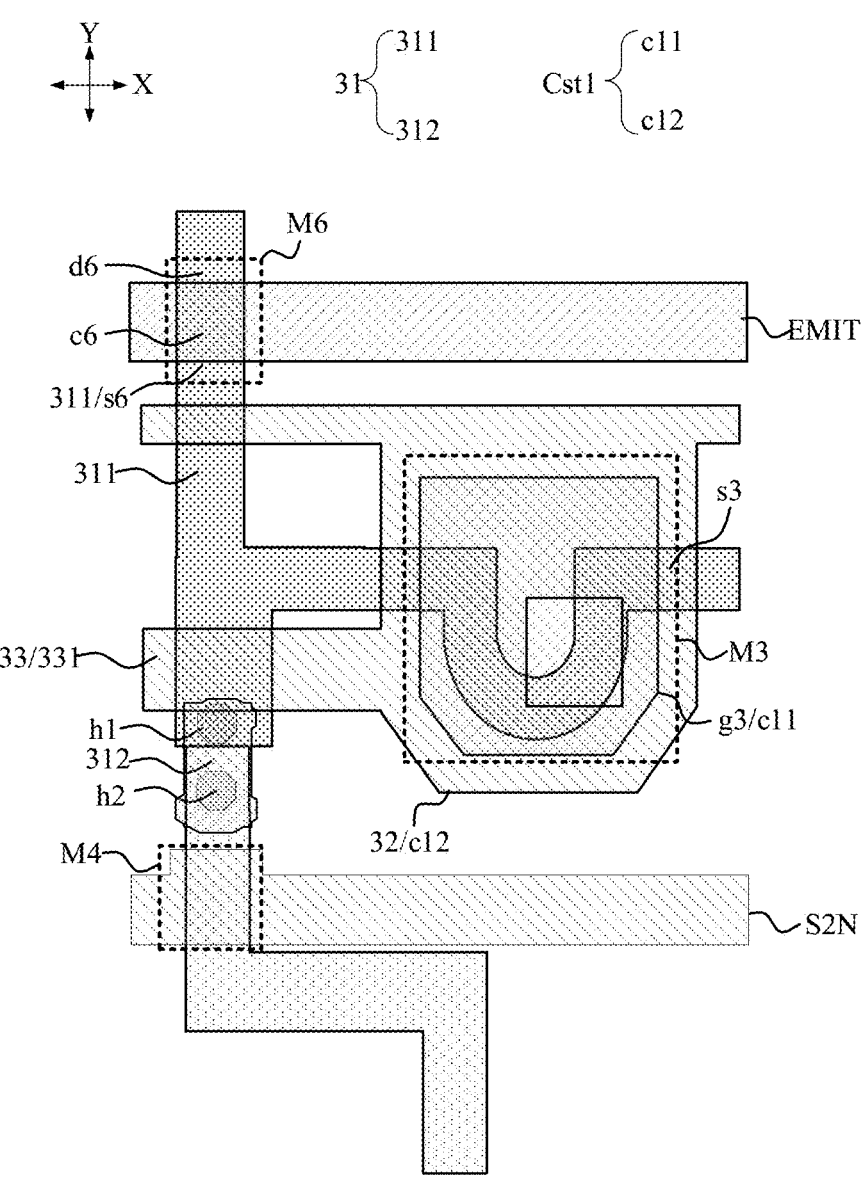
FIG. 11a shows a schematic diagram of a local structure of a pixel circuit in FIG. 11.

In some embodiments, as shown in FIGS. 11 and 11a, the array substrate may further include a branch part 33, and the branch part 33 is connected to the body part 32. An orthographic projection of the branch part 33 on the substrate at least partially overlaps the orthographic projection of the connection part 31 on the substrate.

In the embodiment of the present disclosure, the signal on the branch part 33 is the same as the signal on the body part 32, the branch part 33 overlaps with the connection part 31, which can increase the overlapping area of the two electrode plates of the second capacitor Cst2, to increase the capacitance of the second capacitor Cst2. Thus, it is beneficial to reduce the voltage differences of the first nodes N1 and the third nodes N3 after the coupling due to signal jumping on the scanning line S2N.

It should be noted that the difference between FIG. 11 and FIG. 6 is that compared to FIG. 6, in FIG. 11 the length of the first connection part 311 in the first direction Y is increased, and the position of the first through hole h1 is closer to the position of the scanning line S2N. In addition, the branch part 33 connected to the body part 32 is additionally arranged. In FIG. 11, except for the length of the first connection part 311, the position of the first through hole h1, the length of the second connection part 312, and the additional arranged branch part 33, other structures may be the same as those shown in FIG. 6 and FIGS. 6a to 6g, and are not repeated here.

Figure 12:
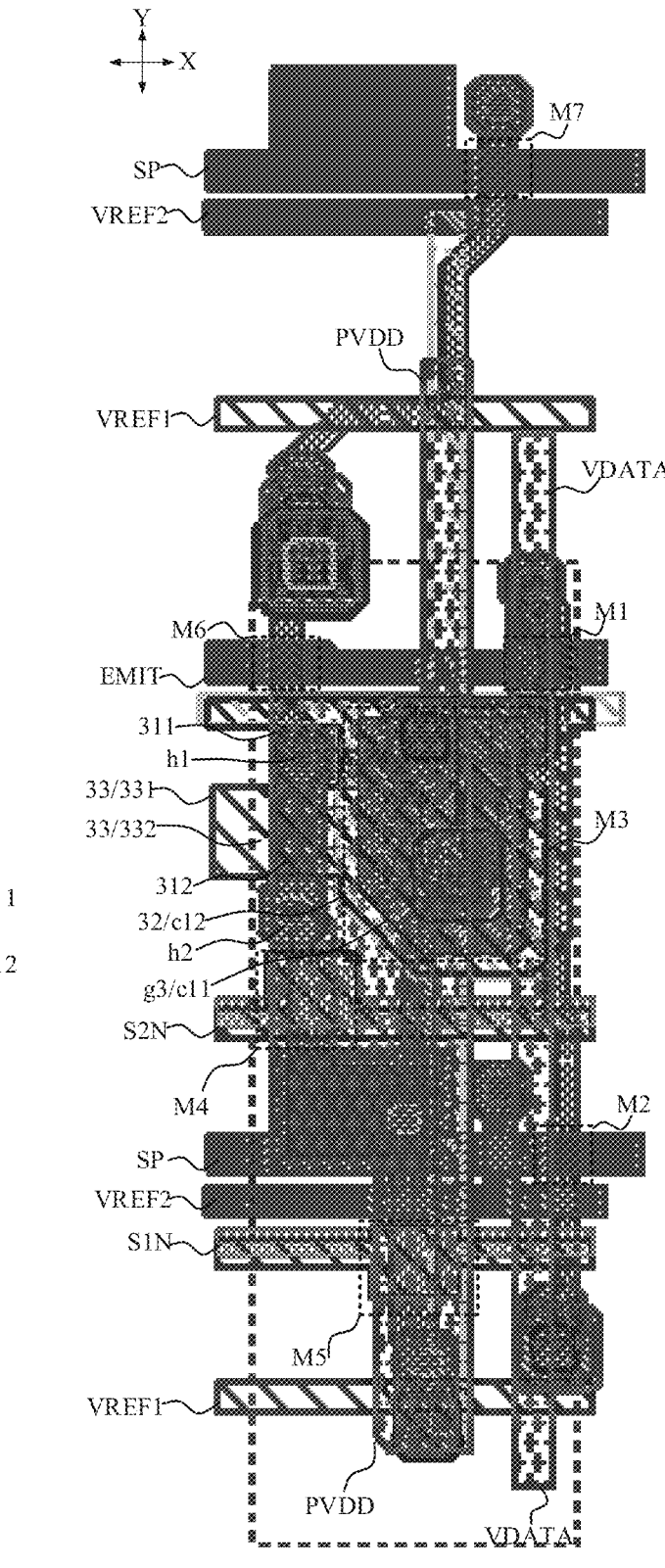
FIG. 12 shows another top view of a local layout of an array substrate according to an embodiment of the present disclosure.
Figure 13:
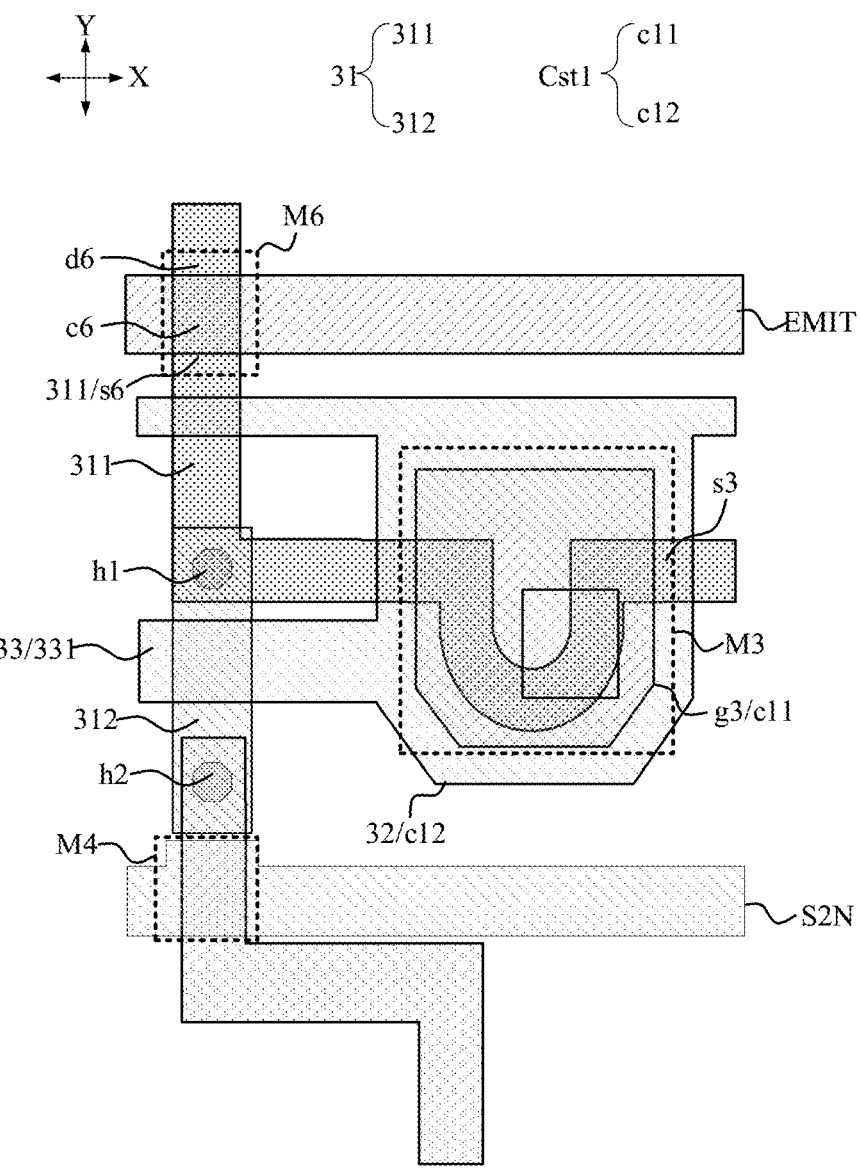
FIG. 13 shows a schematic diagram of a local structure of the local layout in FIG. 12.

In some embodiments, as shown in FIGS. 11 to 13, the second electrode plate c12 of the first capacitor Cst may be the body part 32. The branch part 33 includes a first branch part 331, and the first branch part 331 is connected to the second electrode plate c12 of the first capacitor Cst. An orthographic projection of the first branch part 331 on the substrate may overlap with the orthographic projection of at least one of the first connection part 311 and the second connection part 312 on the substrate.

FIG. 11 shows that the orthographic projection of the first branch part 331 on the substrate overlaps with the orthographic projection of the first connection part 311 on the substrate as an example, and FIGS. 12 and 13 show that the orthographic projection of the first branch part 331 on the substrate overlaps with the orthographic projection of the second connection part 312 on the substrate as an example, which are not intended to limit the present disclosure. It should be noted that the orthographic projection of the first branch part 331 on the substrate may overlap with the orthographic projections of both the first connection part 311 and the second connection part 312 on the substrate.

In order to illustrate the structures of the first branch part 331 and the body part 32, FIG. 13 only shows a part of the structure in FIG. 12.

Figure 16:
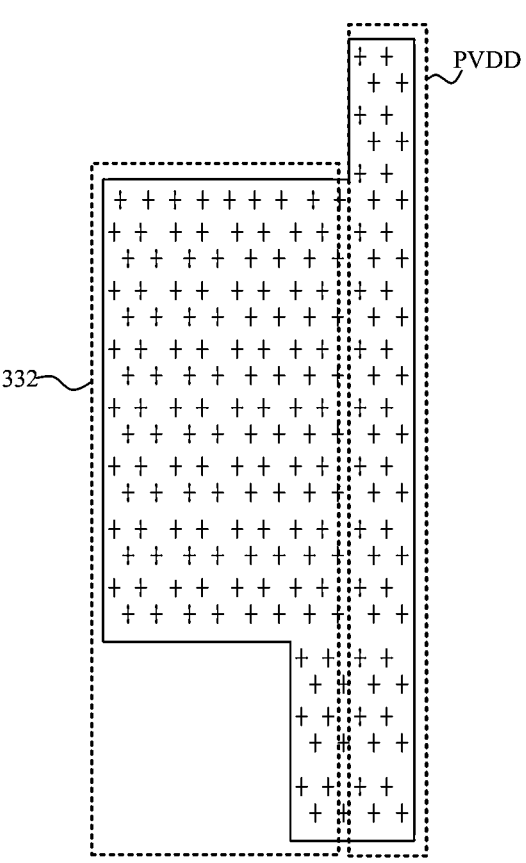
FIG. 16 shows a schematic diagram of a local structure of the local layout in FIG. 15.

It should be noted that the difference between FIG. 12 and FIG. 6 is that compared to FIG. 6, in FIG. 12 the branch part 33 connected to the body part 32 is arranged, and the branch part 33 includes a first branch part 331 and a second branch part 332. FIG. 16 shows a top view of the third metal layer in FIG. 12. In FIG. 12, except that the first branch part 331 is additional arranged and the length of the second branch part 332 in direction Y is increased, other structures may be the same as those shown in FIG. 6 and FIGS. 6a to 6g, and are not repeated here.

In the embodiment of the present disclosure, by connecting the first branch part 331 to the second electrode plate c12 of the first capacitor Cst, connecting wires are not required to connect the first branch part 331 to the power supply voltage signal end, which is beneficial for reducing the number of wires and improving PPI.

In some embodiments, the first branch part 331 and the second electrode plate c12 of the first capacitor Cst may be arranged in the same film layer. In this way, a through hole is not required to connect the first branch part 331 to the second electrode plate c12 of the first capacitor Cst. In addition, the materials of the first branch part 331 and the second electrode plate c12 may also be same, and the first branch part 331 and the second electrode plate c12 can be formed simultaneously.

For example, the first branch part 331 and the second electrode plate c12 of the first capacitor Cst may be arranged in the capacitor metal layer MC as shown in FIG. 5.

For example, the gate g3 of the driving transistor M3 may not only be the gate of the driving transistor M3, but also the first electrode plate c11 of the first capacitor Cst. The gate g3 may be arranged in the first metal layer M11 as shown in FIG. 5.

Figure 14:
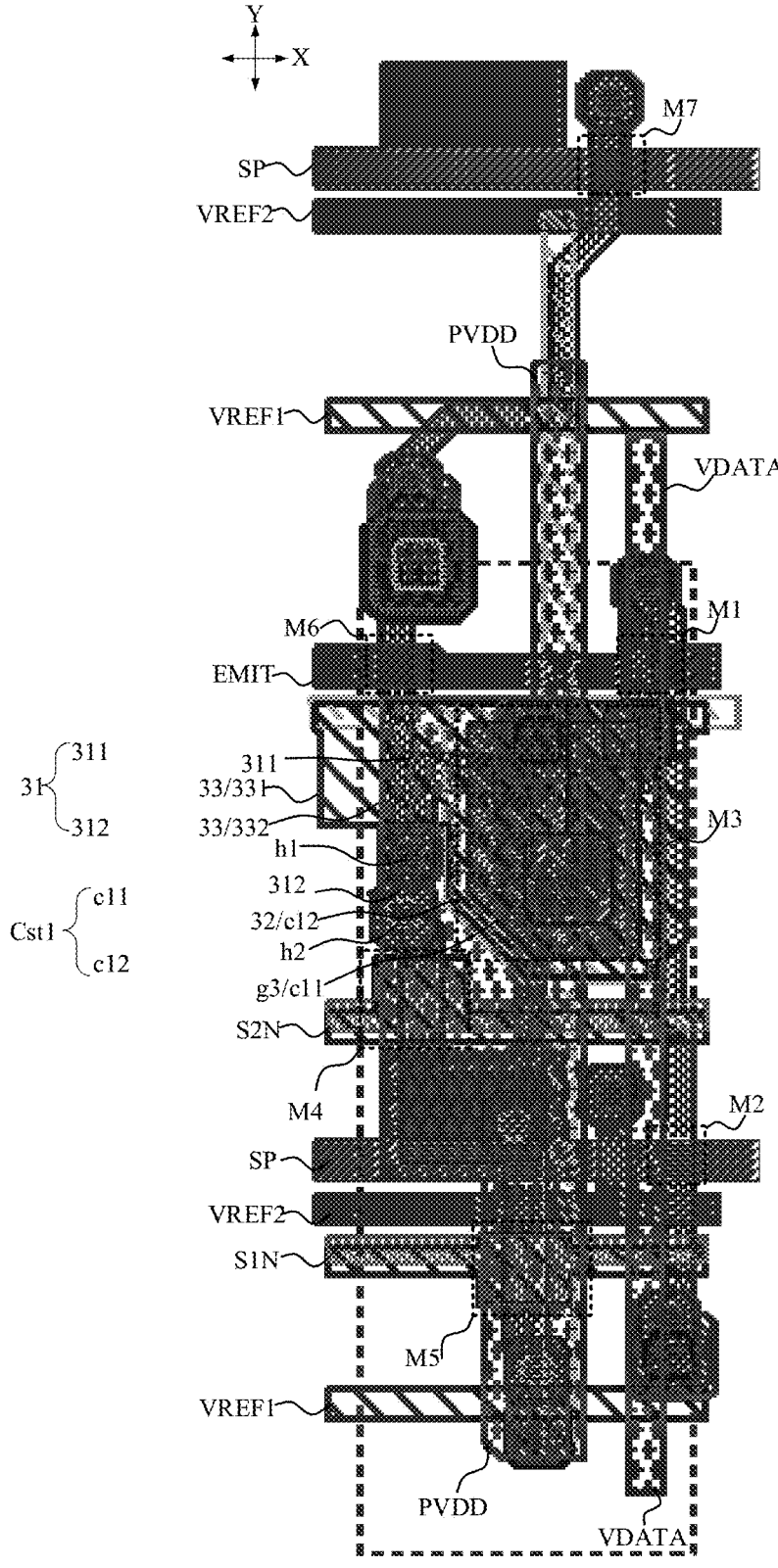
FIG. 14 shows another top view of a local layout of an array substrate according to an embodiment of the present disclosure.
Figure 14A:
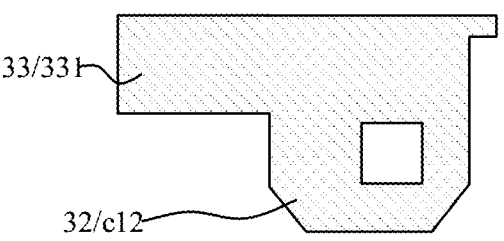
FIG. 14a shows a schematic diagram of a local structure of a pixel circuit in FIG. 14.
Figure 15:
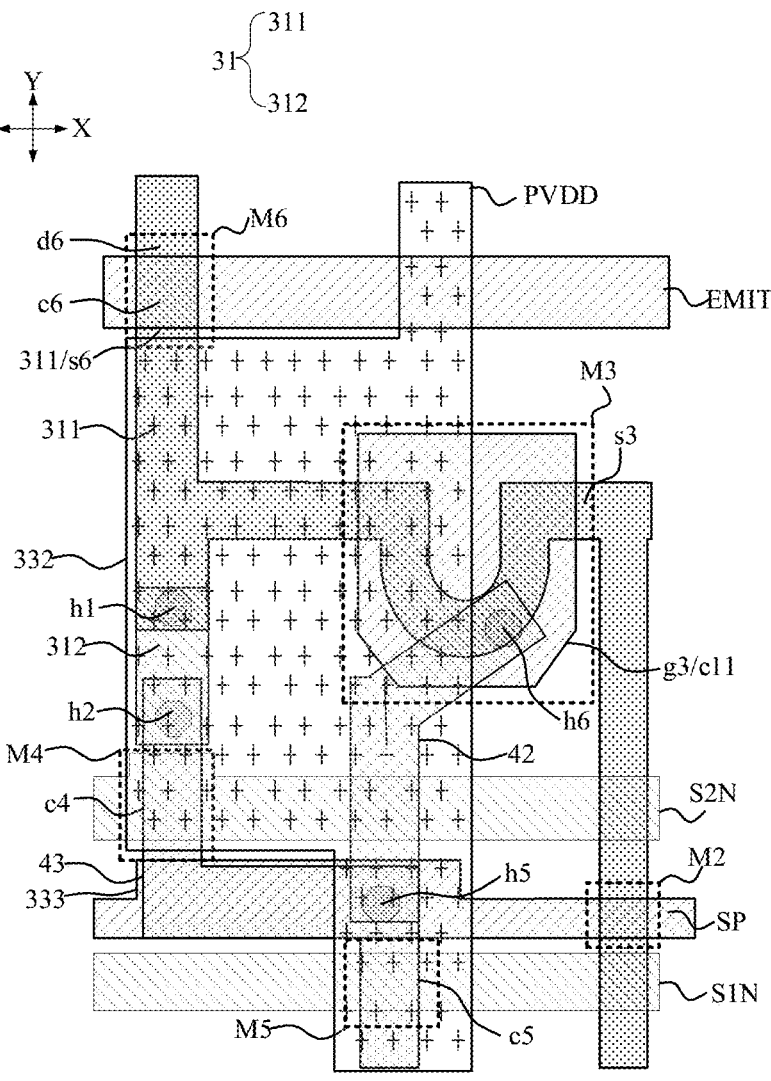
FIG. 15 shows a schematic diagram of a local structure of the local layout in FIG. 14.

In some embodiments, as shown in FIGS. 14, 14a, and 15, the branch part 33 may include a second branch part 332. The second branch part 332 may be electrically connected to the second electrode (for example, the source) of the driving transistor M3. The second branch part 332 may be configured to provide a supply voltage signal to the second electrode of the driving transistor M3. An orthographic projection of the second branch part 332 on the substrate may overlap with the orthographic projection of at least one of the first connection part 311 and the second connection part 312 on the substrate.

FIGS. 14 and 15 schematically show that the orthographic projection of the second branch part 332 on the substrate overlaps with the orthographic projection of both the first connection part 311 and the second connection part 312 on the substrate, which is not intended to limit the present disclosure. In addition, in order to illustrate the structures of the connection part 31, the power wire PVDD and the second branch part 332, FIG. 15 hides parts of the structure in FIG. 14.

In the embodiment of the present disclosure, by electrically connecting the second branch part 332 to the second electrode of the driving transistor M3, the second electrode of the driving transistor M3 is usually electrically connected to the first power wire PVDD. In this way, the second branch part 332 may configured as a branch of the first power wire PVDD, which not only increases the overlapping area of the two electrode plates of the second capacitor Cst2, to increase the capacitance of the second capacitor Cst2, but also thickens the first power wire PVDD, which is beneficial for reducing the voltage drop of the first power wire PVDD.

In some embodiments, the second branch part 332 may be directly electrically connected to the second electrode of the driving transistor M3 via the first power wire PVDD, and no connection lines is required to connect the second branch part 332 to the second electrode of the driving transistor M3, which reduces the number of wires and improves PPI.

It should be noted that the difference between FIG. 14 and FIG. 6 is that compared to FIG. 6, in FIG. 14 the length of the first connection part 311 in the first direction Y is increased and the position of the first through hole h1 is closer to the position of the scanning line S2N. In addition, the branch part 33 connected to the body part 32 is additionally arranged, and the branch part 33 includes the first branch part 331 and the second branch part 332. FIG. 16 shows a top view of the third metal layer in FIG. 14. In FIG. 14, except for the length of the first connection part 311, the position of the first through hole h1, the length of the second connection part 312, the additionally arranged first branch part 331, and the increasing of the length of the second branch part 332 in direction Y, other structures may be the same as those shown in FIG. 6 and FIGS. 6a to 6g, and are not repeated here.

FIG. 16 only shows the second branch part 332 and the first power wire PVDD in FIG. 15, and the second branch part 332 and the first power wire PVDD may be arranged in the same film layer. For example, the second branch part 332 and the first power wire PVDD may be arranged in the third metal layer M13 as shown in FIG. 5. The first power wire PVDD extends in the first direction Y. The second branch part 332 may be considered as a branch part of the first power wire PVDD, while the second branch part 332 does not belong to the body part of the first power wire PVDD.

In some embodiments, as shown in FIG. 15, the threshold compensation transistor M4 may be an oxide transistor. For example, the semiconductor materials of threshold compensation transistor M4 may include IGZO. In the direction perpendicular to the plane where the array substrate is located, the channel c4 of the threshold compensation transistor M4 overlaps with the scanning line S2N. The orthographic projection of the second branch part 332 on the substrate may at least partially overlap with the orthographic projection of the channel c4 of the threshold compensation transistor M4 on the substrate.

As shown in FIG. 15, the pixel circuit includes a first reset transistor M5, the first reset transistor M5 is connected to the gate of the driving transistor M3. The first reset transistor M5 may be an oxide transistor. For example, the semiconductor materials of the first reset transistor M5 may include IGZO. In the direction perpendicular to the plane where the array substrate is located, a channel c5 of the first reset transistor M5 overlaps with a scanning line S1N. The orthographic projection of at least one of the second branch part 332 and the first power wire PVDD on the substrate may at least partially overlap with an orthographic projection of the channel c4 of the first reset transistor M5 on the substrate.

The characteristics of the channel of oxide transistor are prone to change under the influence of light, to affect the stability of the oxide transistor. In the embodiment of the present disclosure, the second branch part 332 and/or the first power wire PVDD may block the light to prevent the light from irradiating the oxide transistor, to improve the stability of the oxide transistor.

In an embodiment, as shown in FIG. 15, the array substrate may include a fifth through hole h5, a sixth through hole h6 and a second wiring part 42.

The first electrode of the first reset transistor M5 is connected to the first reset signal line VREF1. The first electrode of the threshold compensation transistor M4 and the second electrode of the first reset transistor M5 may be connected to one end of the second wiring part 42 via the fifth through hole h5, and the other end of the second wiring part 42 is connected to the gate g3 of the driving transistor M3 via the sixth through hole h6. The second wiring part 42 may be arranged in the second metal layer M12 as shown in FIG. 5. The first reset signal line VREF1 may be arranged in the capacitor metal layer MC as shown in FIG. 5.

In some embodiments, as shown in FIGS. 14 and 15, the pixel circuit may include the first reset transistor M5 and the data write transistor M2. The first electrode of the first reset transistor M5 is connected to the first reset signal line VREF1, the second electrode of the first reset transistor M5 is connected to the first electrode of the threshold compensation transistor M4 through a third connection part 43, the first electrode of the data writing transistor M2 is connected to a data line VDATA, and the second electrode of the data writing transistor M2 is connected to the second electrode of the driving transistor M3. The third connection part 43 is connected to the gate of the driving transistor M3. The potential of the third connection part 43 may be equal to the potential of the gate of the driving transistor M3.

The third connection part 43, the channel of the first reset transistor M5 and the channel of the threshold compensation transistor M4 may be arranged in the same film layer. The materials of the third connection part 43 may include IGZO.

The data writing transistor M2 may be a P-type transistor, while the first reset transistor M5 and threshold compensation transistor M4 may be N-type transistors. The gate of the data writing transistor M2 is connected to a first scanning line SP, the first scanning line SP includes a third branch part 333. An orthographic projection of the third branch part 333 on the substrate at least partially overlaps with the orthographic projection of the third connection part 43 on the substrate.

As shown in FIG. 8, when the signal on the first scanning line SP is at a low level and the signal on the scanning line S2N is at a high level, the data writing transistor M2 and threshold compensation transistor M4 are turned on, and the data signal on the data line can be written to the gate of the driving transistor M3. Then, the signal on the first scanning line SP jumps from the low level to a high level, and the signal on the scanning line S2N jumps from the high level to a low level. The signal jumping direction on the first scanning line SP is opposite to the signal jumping direction on the scanning line S2N, and the signal on the third branch part 333 is the same as the signal on the first scanning line SP. In this way, the coupling of the signal jumping on the third branch part 333 to the third connection 43 may at least partially cancel the coupling of the signal jumping on the scanning line S2N to the third connection 43, to improve the potential stability of the third connection 43, and also improving the potential stability of the gate of the driving transistor M3.

Figure 17:
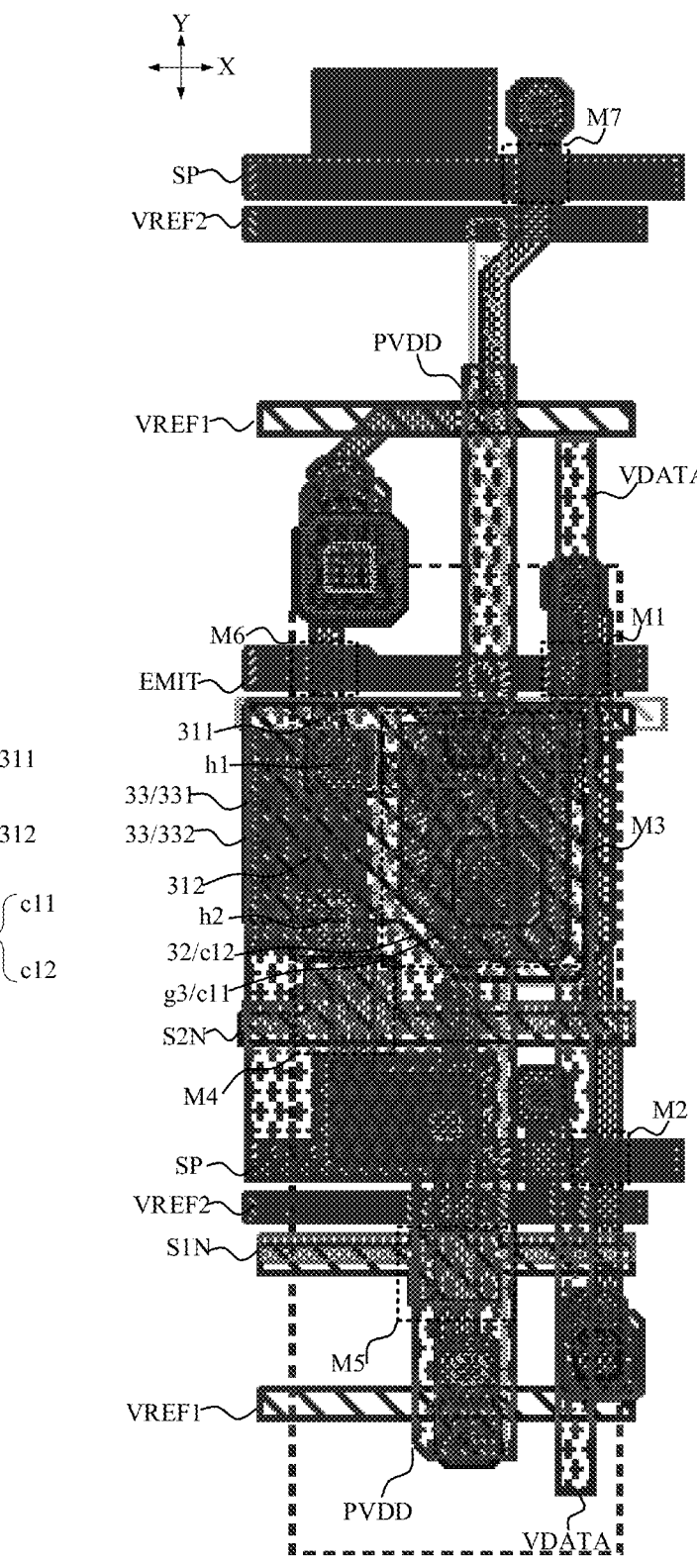
FIG. 17 shows another top view of a local layout of an array substrate according to an embodiment of the present disclosure.
Figure 17A:
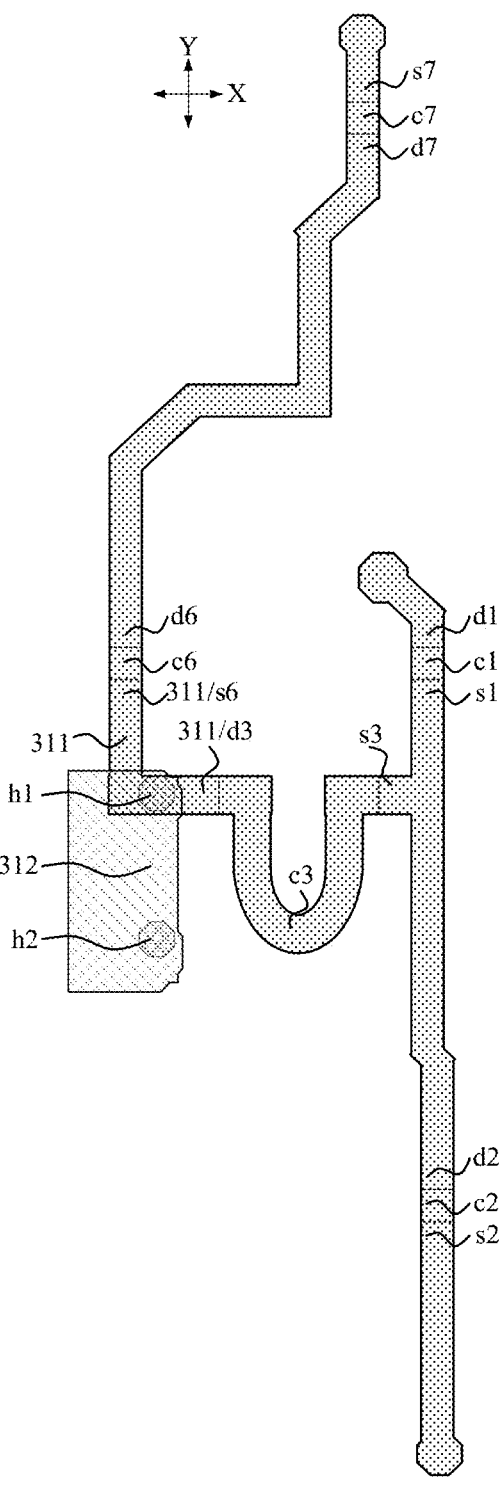
FIG. 17a shows a schematic diagram of a local structure of a pixel circuit in FIG. 17.
Figure 18:
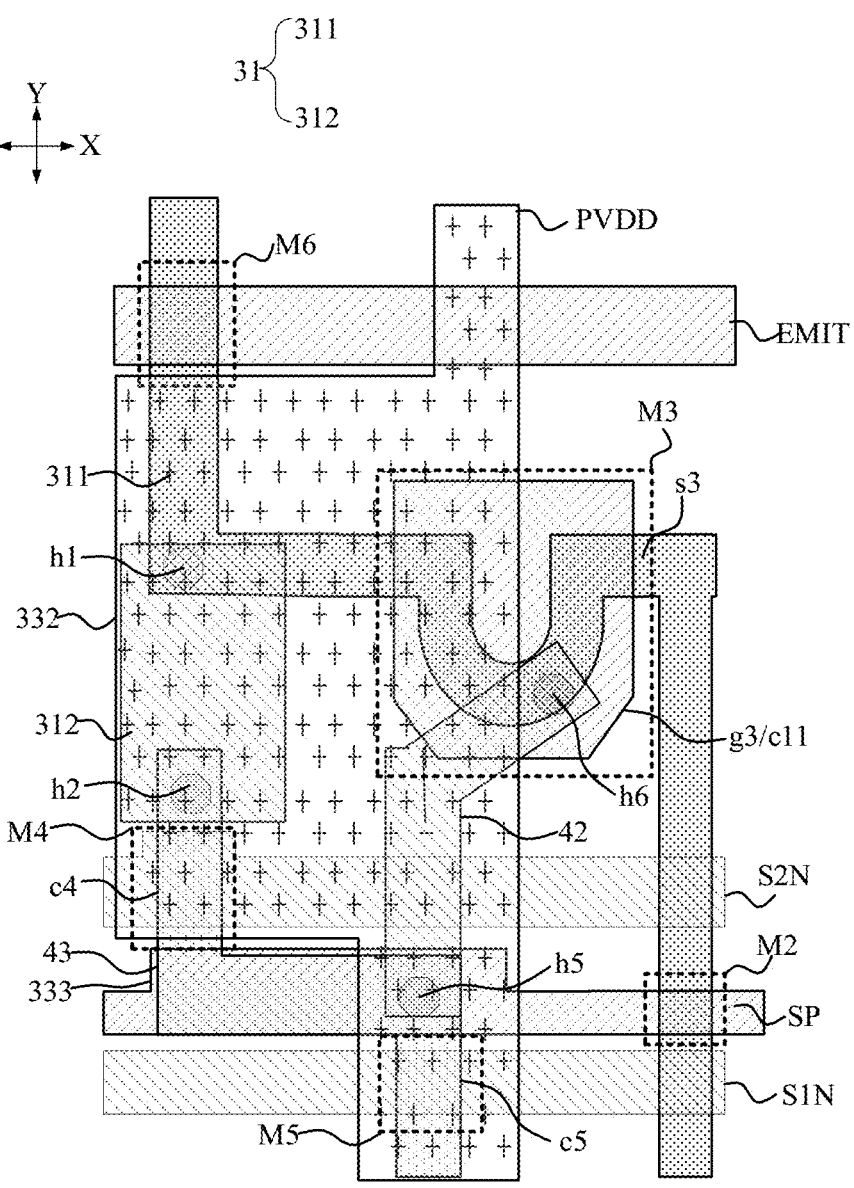
FIG. 18 shows a schematic diagram of a local structure of the local layout in FIG. 17.

In some embodiments, as shown in FIGS. 17, 17a, and 18, the second connection part 312 extends in the first direction Y, and the first connection part 311 may include a part extending in the first direction Y and a part extending in the second direction X. A width of the second connection part 312 in the second direction X is greater than a width of the first connection part 311 extending in the first direction Y in the second direction X. In one embodiment, the width of the second connection part 312 in the second direction X is greater than a width of the first power wire PVDD in the second direction X. In one embodiment, the width of the second connection part 312 in the second direction X is greater than a width of the data line VDATA in the second direction X.

In this way, it is equivalent that the width of the second connection part 312 is increased, which increases the overlapping area between the second connection part 312 and the branch part 33 (for example, the second branch part 332), to increase the capacitance of the second capacitor Cst2 and reducing the voltage differences of the first nodes N1 and the third nodes N3 after coupling due to signal jumping on the scanning line S2N.

Figure 17B:
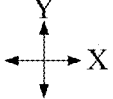
FIG. 17b shows a schematic diagram of another local structure of a pixel circuit in FIG. 17.
Figure 17B:
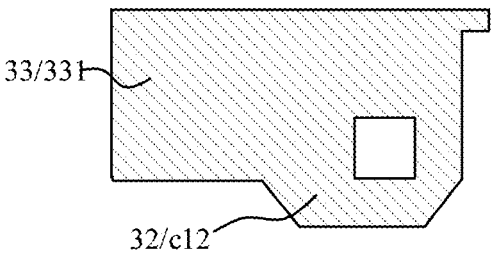

It should be noted that the difference between FIG. 17 and FIG. 6 is that compared to FIG. 6, in FIG. 17 the branch part 33 connected to the body part 32 is arranged and the branch part 33 includes a first branch part 331 and a second branch part 332. FIG. 16 shows a top view of the third metal layer in FIG. 17. The structures of the first branch part 331 and the second electrode plate c12 of the first capacitor Cst1 in FIG. 17 may be as shown in FIG. 17b. In FIG. 17, except that the first branch part 331 is additionally arranged, and the length of the second branch part 332 in direction Y is increased, other structures may be the same as those shown in FIG. 6 and FIGS. 6a to 6g, and are not repeated here.

Figure 19:
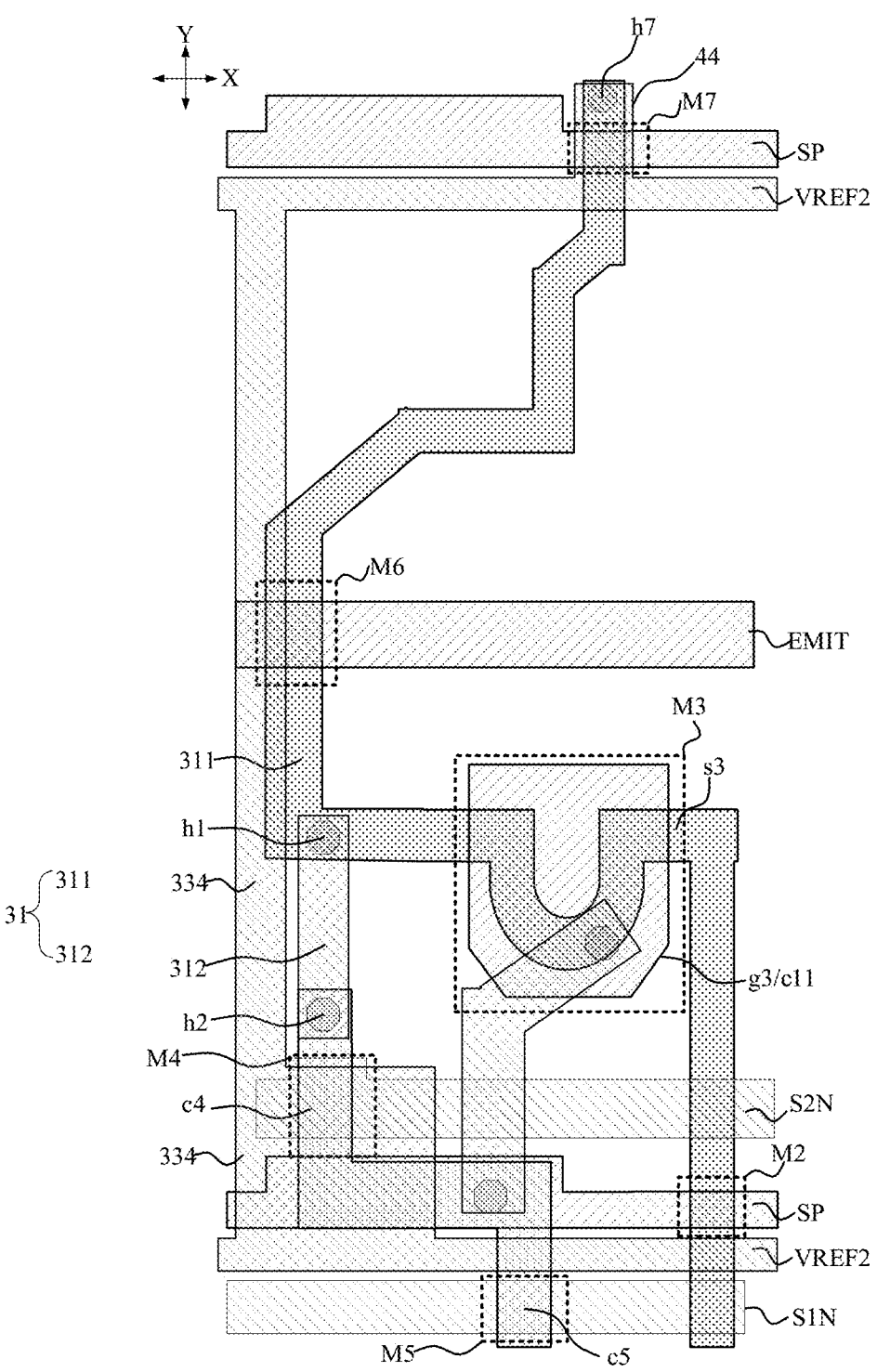
FIG. 19 shows another top view of a local layout of an array substrate according to an embodiment of the present disclosure.
Figure 19A:
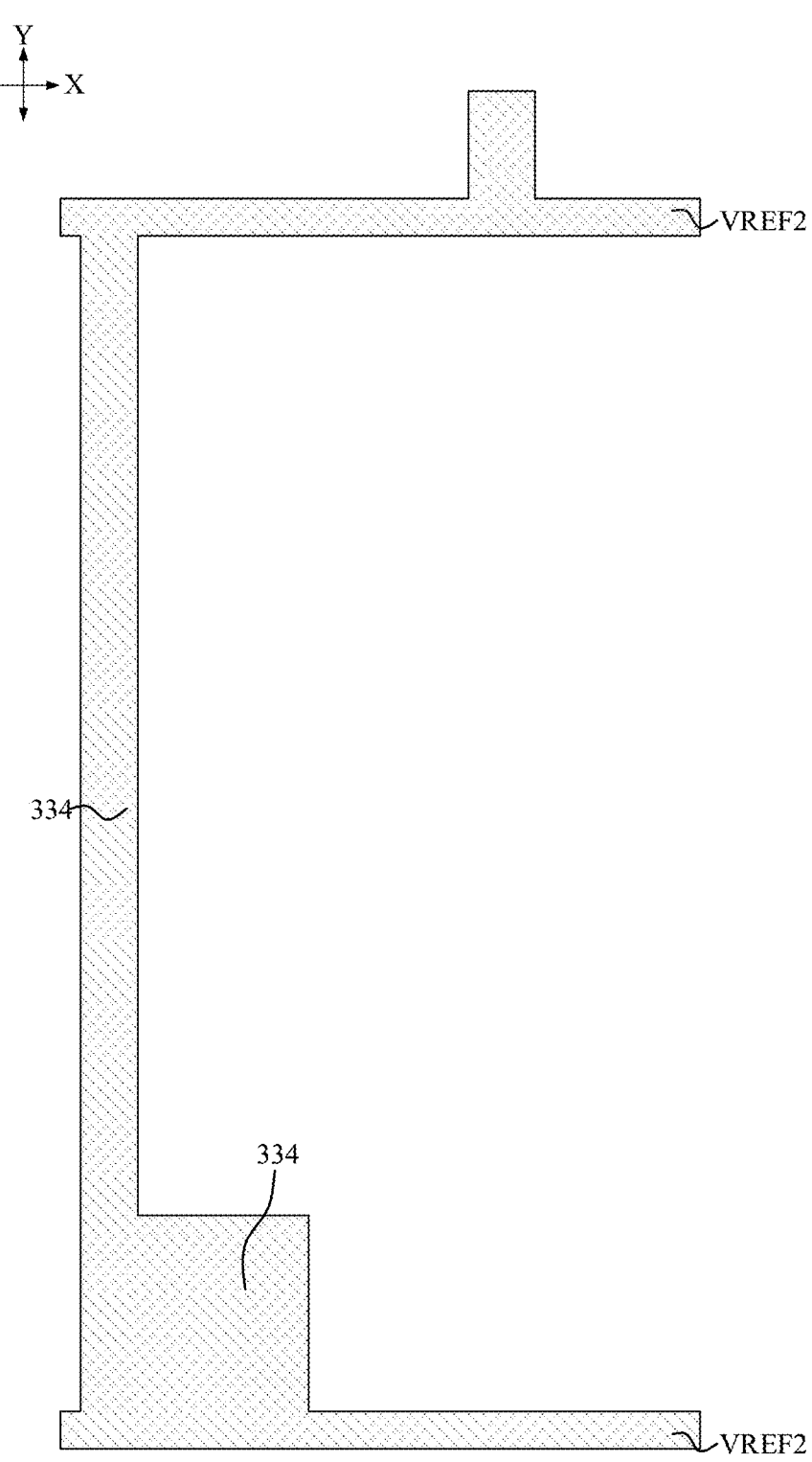
FIG. 19*a* shows a schematic diagram of a local structure of a pixel circuit in FIG. 19.

In some embodiments, as shown in FIGS. 19 and 19a, the pixel circuit may include a second reset transistor M7, a first electrode of the second reset transistor M7 is connected to a second reset signal line VREF2, and a second electrode of the second reset transistor M7 is connected to a first electrode of a light-emitting element. The second reset transistor M7 may be configured to reset the first electrode of the light-emitting element.

In an embodiment, the second reset signal line VREF2 may be arranged in the second metal layer M12 as shown in FIG. 5. The array substrate may include a fourth wiring part 44 and a seventh through hole h7. The fourth wiring part 44 is connected to the second reset signal line VREF2 and the seventh through hole h7, and the seventh through hole h7 is connected to the first electrode of the second reset transistor M7, to realize the connection between the first electrode of the second reset transistor M7 and the second reset signal line VREF2.

Continuing to refer to FIG. 19, the second reset signal line VREF2 may include a fourth branch part 334, and an orthographic projection of the fourth branch part 334 on the substrate at least partially overlaps with the orthographic projection of the connection part 31 on the substrate. For example, the orthographic projection of the fourth branch part 334 on the substrate at least partially overlaps with the orthographic projection of the first connection part 311 on the substrate.

In this way, the part where the fourth branch part 334 and the connection part 31 are overlapped may be the second capacitor Cst2 connected to the first electrode of the driving transistor M3, and the second reset signal line VREF2 can be utilized, which is beneficial for increasing the capacitance of the second capacitor Cst2 without increasing the size of the pixel circuit.

It should be noted that FIG. 19a only shows the structures of the second reset signal line VREF2 and the fourth branch part 334.

The difference between FIG. 19 and FIG. 6 is that compared to FIG. 6, in FIG. 19 the fourth branch part 334 is arranged. In FIG. 19, except that the fourth branch part 334 is additionally arranged, other structures may be the same as those shown in FIG. 6 and FIGS. 6a to 6g, and are not repeated here.

In some embodiments, second reset signal lines VREF2 extends in the second direction X, and multiple second reset signal lines VREF2 are arranged in the first direction Y. The fourth branch part 334 may be connected to two adjacent second reset signal lines VREF2. Multiple fourth branch parts 334 and multiple second reset signal lines VREF2 may configured as a grid like structure, which is beneficial for reducing the voltage drop of the second reset signal line VREF2.

In some embodiments, the threshold compensation transistor M4 is an oxide transistor, and the orthographic projection of the fourth branch part 334 on the substrate may at least partially overlap with the orthographic projection of the channel c4 of the threshold compensation transistor M4 on the substrate.

In the embodiment of the present disclosure, the fourth branch part 334 may be used to block the light to prevent the light from irradiating the oxide transistor, to improve the stability of the oxide transistor.

In some embodiments, as shown in FIG. 7, the pixel circuit includes a first reset transistor M5, a first electrode of the first reset transistor M5 is connected to the first reset signal line VREF1, and a second electrode of the first reset transistor M5 and the first electrode of the threshold compensation transistor M4 are both connected to the gate of the driving transistor M3.

The gate of the first reset transistor M5 is connected to the second scanning line S1N, the gate of the threshold compensation transistor M4 is connected to the third scanning line S2N, the second scanning line S1N provides a second scanning signal, and the third scanning line S2N provides a third scanning signal. As shown in FIG. 8, the turn-on level of the first scanning signal at least partially overlaps with the turn-on level of the second scanning signal in time.

When the signal on the second scanning line S1N and the signal on the third scanning line S2N are both at the turn-on level, the first reset transistor M5 and the threshold compensation transistor M4 are turned on. In this way, the reset signal on the first reset signal line VREF1 can be transmitted to the third node N3 to reset the third node N3, which can improve the effectiveness of the data signal writing.

The reset signal on the first reset signal line VREF1 may be a negative voltage signal. For example, the reset signal on the first reset signal line VREF1 is a voltage signal of around −3V.

In some embodiments, transistors may also be additionally arranged to reset the third node N3. As shown in FIGS. 20, 20a to 22, the pixel circuit may include a first reset transistor M5 and a third reset transistor M8. A first electrode of the first reset transistor M5 is connected to the first reset signal line VREF1, a second electrode of the first reset transistor M5 is connected to the gate g3 of the driving transistor M3, a first electrode of the third reset transistor M8 is connected to the first reset signal line VREF1, and a second electrode of the third reset transistor M8 is connected to the first electrode of the driving transistor M3. In this way, the third node N3 can be directly reset by using the third reset transistor M8.

As an example, the threshold compensation transistor M4, the first reset transistor M5 and the third reset transistor M8 are oxide transistors. FIG. 20a only shows the structure of the film layer where the active layer of the oxide transistor is located and the structure of the second connection part 312 in FIG. 20. The active layer of the third reset transistor M8 may include a channel c8, a source s8 and a drain d8. The second connection part 312 may be connected to the second electrode of the third reset transistor M8 via a thirteenth through hole h13.

Figure 20:
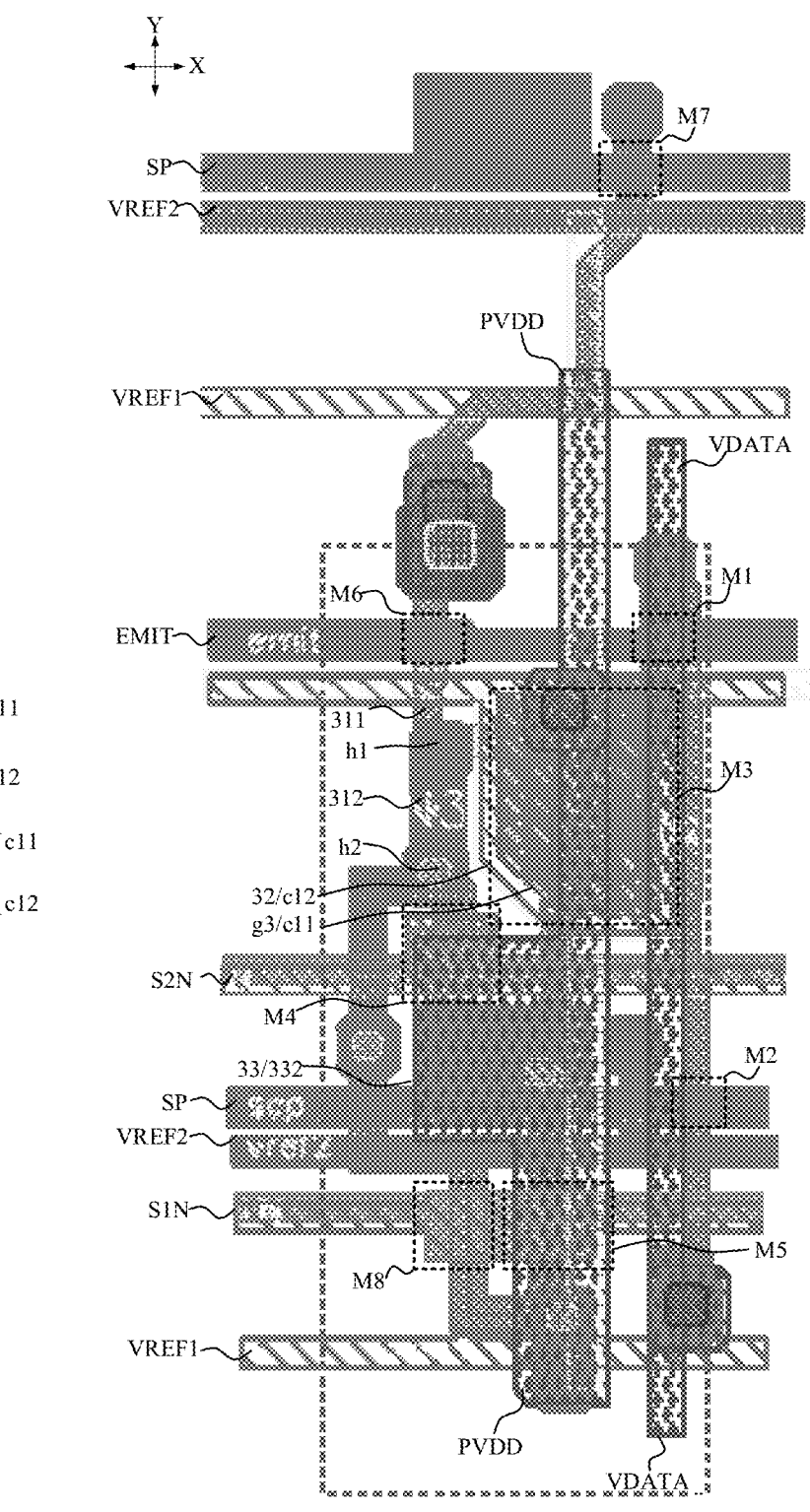
FIG. 20 shows another top view of a local layout of an array substrate according to an embodiment of the present disclosure.
Figure 20A:
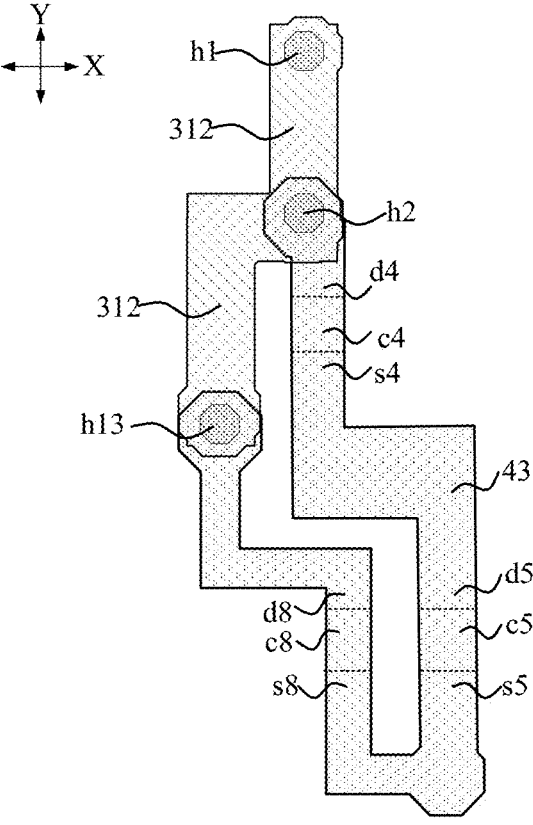
FIG. 20*a* shows a schematic diagram of a local structure of a pixel circuit in FIG. 20.

The difference between FIG. 20 and FIG. 6 is that compared to FIG. 6, in FIG. 20 the third reset transistor M8 is arranged. In FIG. 20, except for the structure of the film layer where the active layer of the oxide transistor is located and the structure of the second connection part 312, other structures may be the same as those shown in FIG. 6 and FIGS. 6a to 6g, and are not repeated here.

Figure 21:
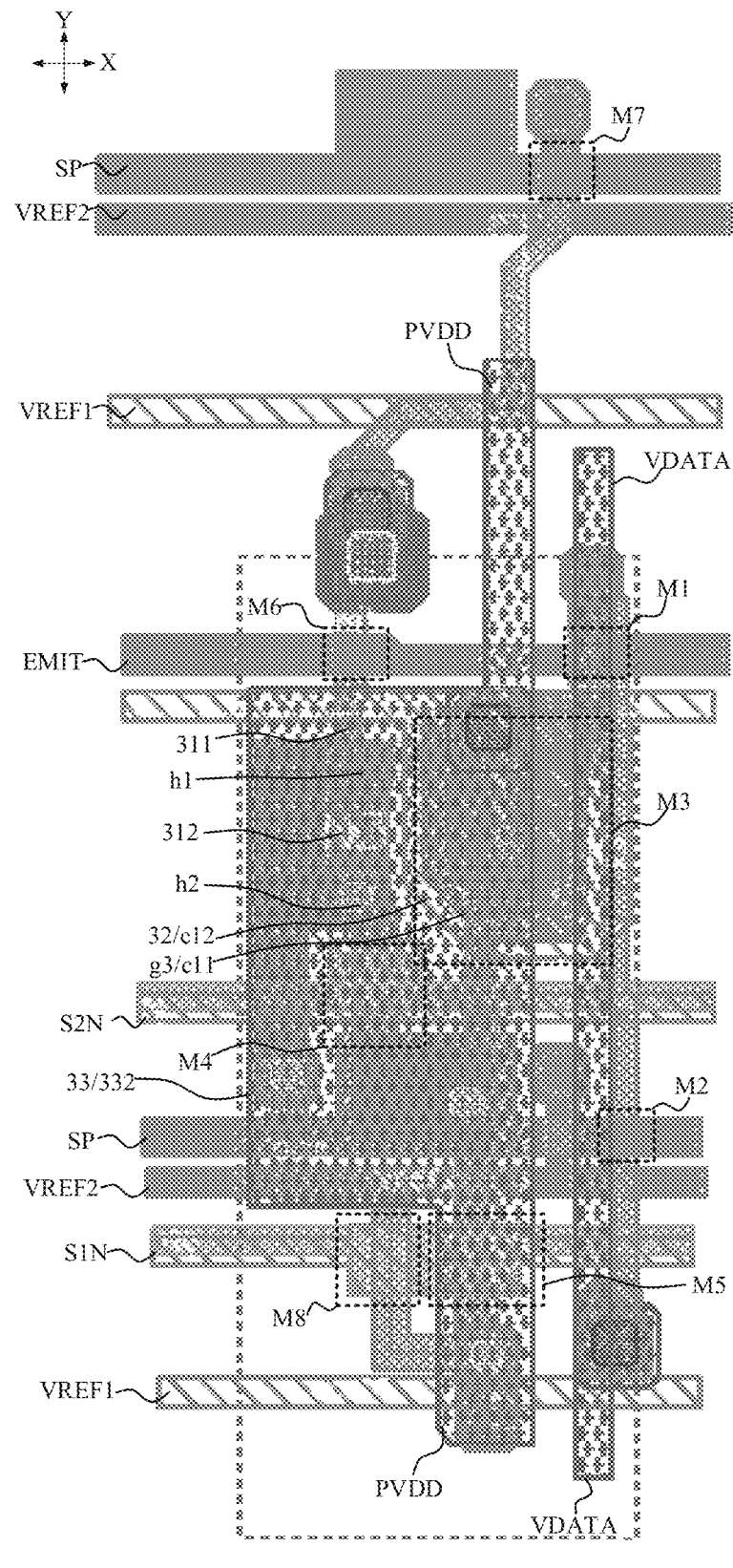
FIG. 21 shows another top view of a local layout of an array substrate according to an embodiment of the present disclosure.
Figure 21A:
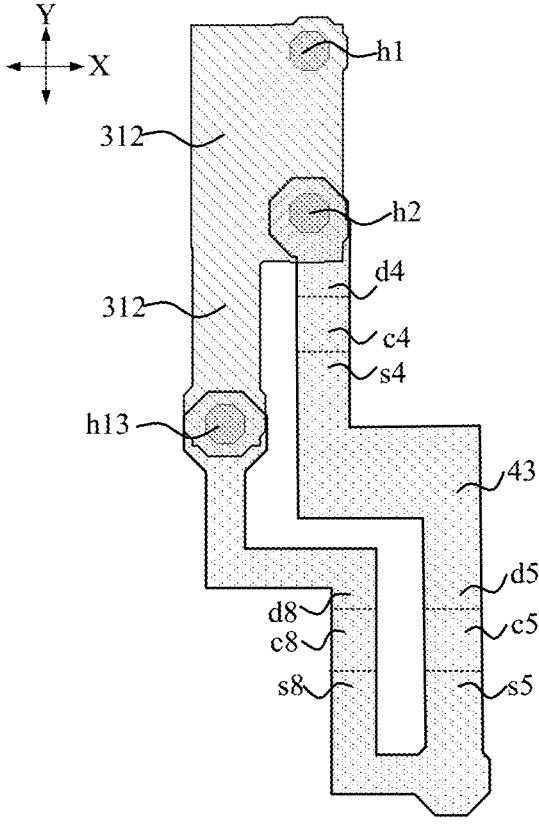
FIG. 21*a* shows a schematic diagram of a local structure of a pixel circuit in FIG. 21.

FIG. 21a only shows the structure of the film layer where the active layer of the oxide transistor is located and the structure of the second connection part 312 in FIG. 21. The structures of the power wire PVDD and the second branch part 332 in FIG. 21 may be as shown in FIG. 16.

The differences between FIG. 21 and FIG. 20 include: in FIG. 21 the width of the second connection part 312 extending between the first through hole h1 and the second through hole h2 is increased, the length of the second branch part 332 in the direction Y is increased, and other structures may be the same as those shown in FIG. 20, and are not repeated here.

Figure 22:
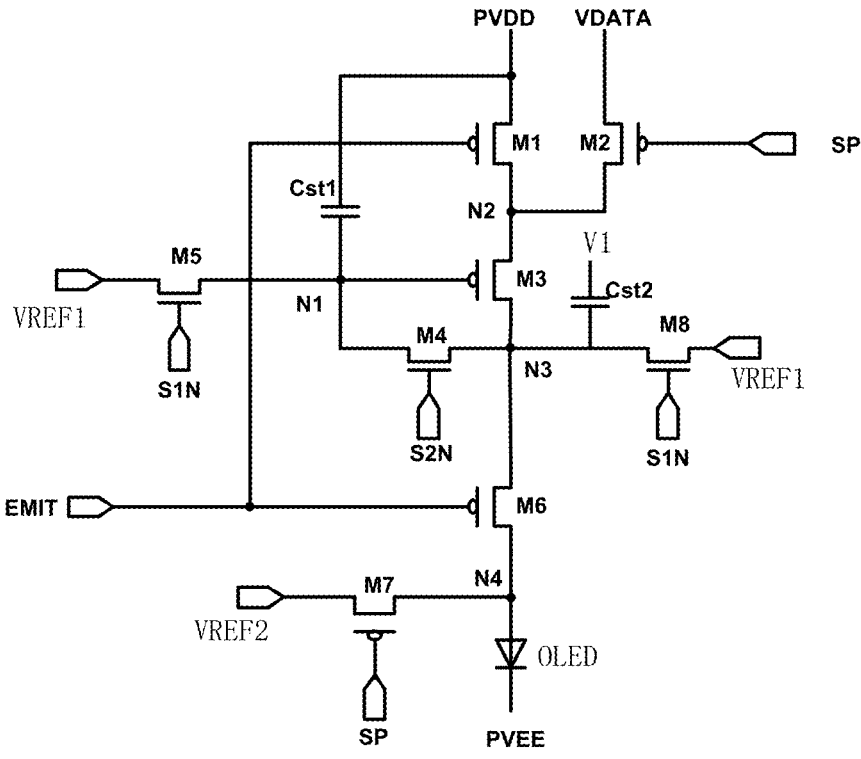
FIG. 22 shows a structural schematic diagram of another equivalent circuit of a pixel circuit in an array substrate according to an embodiment of the present disclosure.

In some embodiments, as shown in FIG. 22, the types of the first reset transistor M5 and the third reset transistor M8 may be same. For example, both the first reset transistor M5 and the third reset transistor M8 are N-type transistors. As shown in FIG. 21, the gate of the first reset transistor M5 and the gate of the third reset transistor M8 are connected to the same second scanning line S1N. In this way, the number of scanning lines can be reduced, which is beneficial for improving PPI.

Figure 24:
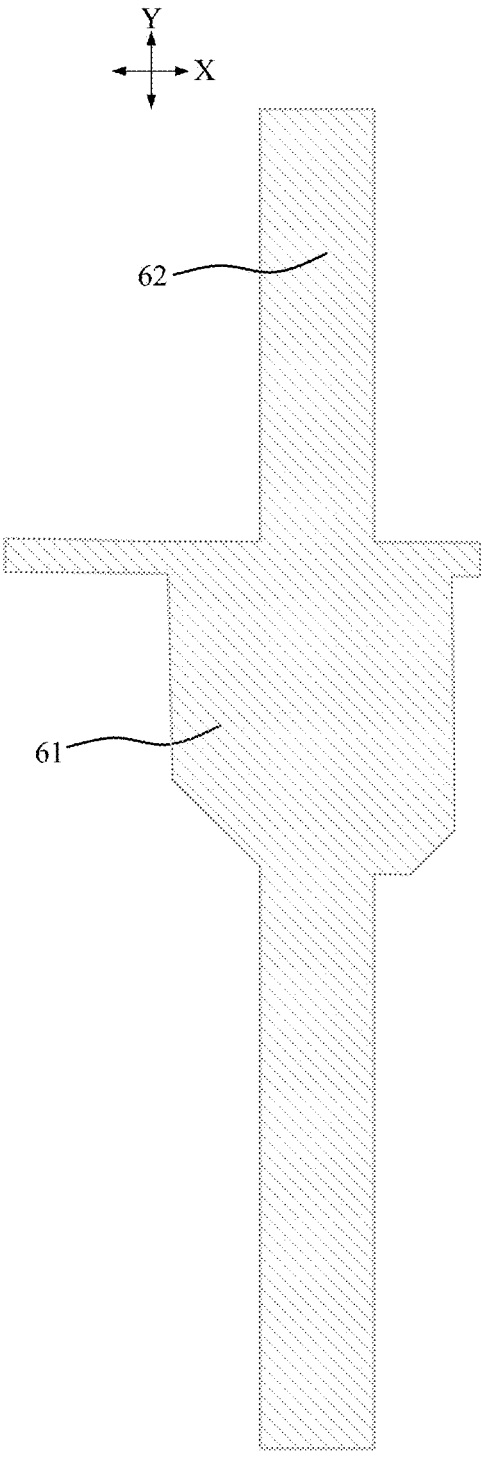
FIG. 24 shows a top view of an auxiliary metal layer in FIG. 6.
Figure 25:
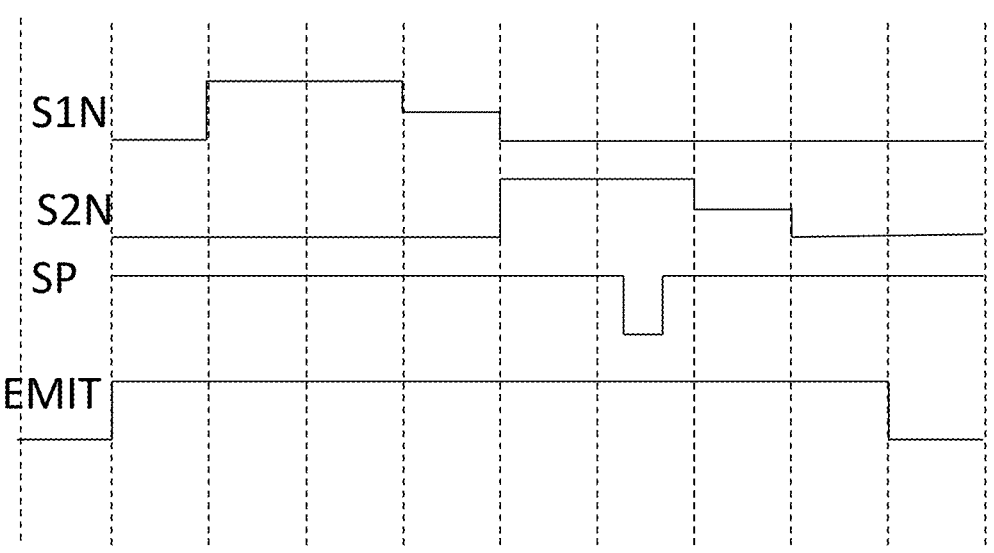
FIG. 25 shows a timing diagram of FIG. 22.

As shown in FIG. 24, the types of the first reset transistor M5 and the third reset transistor M8 may be different. For example, the first reset transistor M5 is an N-type transistor, and the third reset transistor M8 is a P-type transistor. In this case, the gate of the first reset transistor M5 and the gate of the third reset transistor M8 may be connected to different scanning lines. For example, the gate of the first reset transistor M5 is connected to the scanning line S1N, and the gate of the third reset transistor M8 is connected to the scanning line SP0. The gate of the data writing transistor is connected to the scanning line SP1. As shown in FIG. 25, the turn-on level on the scanning line SP0 is earlier than the turn-on level on the scanning line SP1, to reset the third node N3 before writing the data signal.

As shown in FIG. 22, the gate of the threshold compensation transistor M4 is connected to the third scanning line S2N, the second scanning line S1N provides the second scanning signal, and the third scanning line S2N provides the third scanning signal. The turn-on level of the first scanning signal at least partially overlaps with the turn-on level of the second scanning signal in time. In one embodiment, the turn-on level of the first scanning signal may not be overlapped with the turn-on level of the second scanning signal in time. Due to the arrangement of the third reset transistor M8, even if the turn-on levels of the two scanning signals do not overlap, the third node N3 can be reset.

For example, a capacitance of the first capacitor Cst1 is C1, and a capacitance of the second capacitor Cst2 is C2. In one embodiment, in the case of $0.8*C1 \leq C2 \leq 1.2*C1$, the voltage differences of the first nodes N1 and the third nodes N3 after the coupling due to signal jumping on the scanning line S2N can be reduced effectively.

It is to be noted that the second capacitor Cst2 may include the capacitor formed by overlapping the body part and/or the branch part with the connection part according to any of the above embodiments.

Some embodiments are also conducted simulation test on the impact of a capacitor connecting to the third node N3 on the brightness, and some test data are shown in Tables 1 and 2. In Tables 1 and 2, N3 without capacitor indicates that no capacitor is connected to the third node N3, while N3 with capacitor indicates that the second capacitor Cst2 is connected to the third node N3. For example, the capacitance of the second capacitor Cst2 connected to the third node N3 is 86.7fF. Scan_RS indicates that the signal on the scanning line (for example, the scanning line S2N) is not trailing, and Scan_R indicates that the signal on the scanning line is trailing. The simulation test proves that in the case that the third node N3 is connected to the second capacitor Cst2, regardless of whether the gate control signal output by the shift register is trailing or not, the impact of the shift of the threshold voltage Vth of the transistor in the shift register on brightness is reduced.

TABLE 1

| Scan_RS (Low Gray Scale) | | | | |
| --- | --- | --- | --- | --- |
| | N3 without Capacitor | | N3 with Capacitor | |
| Shift of Vth | Driving Current | Current Change | Driving Current | Current Change |
| −4 | −1.10E−09 | 4.3% | −1.04E−09 | −3.8% |
| −3 | −1.11E−09 | 5.2% | −1.05E−09 | −2.9% |
| −2 | −1.09E−09 | 3.5% | −1.05E−09 | −2.5% |
| 1 | −1.07E−09 | 1.8% | −1.08E−09 | −0.1% |
| 0 | −1.06E−09 | 0.0% | −1.08E−09 | 0.0% |
| 1 | −1.03E−09 | −2.6% | −1.06E−09 | −2.1% |
| 2 | −1.03E−09 | −2.2% | −1.07E−09 | −0.8% |

TABLE 2

| Scan_R (Low Gray Scale) | | | | |
| --- | --- | --- | --- | --- |
| | N3 without Capacitor | | N3 with Capacitor | |
| Shift of Vth | Driving Current | Current Change | Driving Current | Current Change |
| −4 | −9.31E−10 | −12.9% | −1.07E−09 | −1.2% |
| −3 | −9.61E−10 | −10.1% | −1.07E−09 | −1.5% |

TABLE 2-continued

| Scan_R (Low Gray Scale) | | | | |
| --- | --- | --- | --- | --- |
| | N3 without Capacitor | | N3 with Capacitor | |
| Shift of Vth | Driving Current | Current Change | Driving Current | Current Change |
| −2 | −1.04E−09 | −3.2% | −1.07E−09 | −1.7% |
| −1 | −1.09E−09 | 1.4% | −1.08E−09 | −0.7% |
| 0 | −1.07E−09 | 0.0% | −1.09E−09 | 0.0% |
| 1 | −1.06E−09 | −1.0% | −1.07E−09 | −2.0% |
| 2 | −1.03E−09 | −3.6% | −1.09E−09 | −0.1% |

Figure 23:
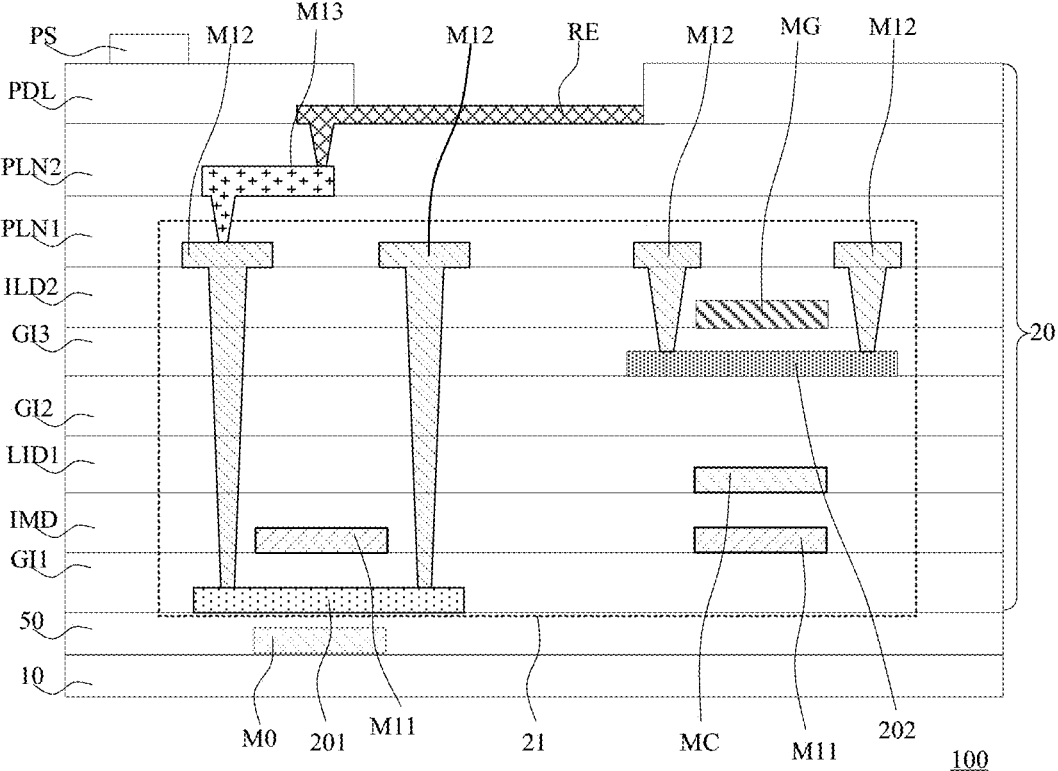
FIG. 23 shows a schematic diagram of another cross-section structure of an array substrate according to an embodiment of the present disclosure.

In some embodiments, as shown in FIG. 23, the array substrate may further include an auxiliary metal layer M0 and a buffer layer 50, the buffer layer 50 is arranged between the first semiconductor layer 201 and the substrate 10, and the auxiliary metal layer M0 is arranged between the buffer layer 50 and the substrate 10.

As shown in FIG. 6 and FIG. 24, the array substrate may further include a first auxiliary structure 61 and a second auxiliary structure 62. The first auxiliary structure 61 and the second auxiliary structure 62 may be arranged in the auxiliary metal layer M0.

An orthographic projection of the first auxiliary structure 61 on the substrate may at least partially overlap with the orthographic projection of the channel of the driving transistor M3 on the substrate. In this way, the first auxiliary structure 61 can be used to block the channel of the driving transistor M3 from being irradiated by light.

An orthographic projection of the second auxiliary structure 62 on the substrate may at least partially overlap with the orthographic projection of the power wire PVDD on the substrate. The array substrate may include a display area and a non-display area at least partially surrounding the display area, and the second auxiliary structure 62 may be connected to the power wire PVDD via through holes in the non-display area. In this way, it is helpful to reduce the voltage drop of the power wire PVDD.

The first auxiliary structure 61 and the second auxiliary structure 62 may be interconnected.

In some embodiments, a pixel circuit is also provided according to the embodiments of the present disclosure. As shown in FIG. 7, the pixel circuit may include a driving transistor M3, a threshold compensation transistor M4, and a second capacitor Cst2. A first electrode of the threshold compensation transistor M4 is electrically connected to a gate of the driving transistor M3, and a second electrode of the threshold compensation transistor M4 is electrically connected to a first electrode of the driving transistor M3. The second capacitor Cst2 is electrically connected between the first electrode of the driving transistor M3 and the power supply voltage signal end V1.

In some embodiments, as shown in FIG. 7, a second electrode of the driving transistor M3 is electrically connected to a first power supply end, the first power supply end provides a positive voltage signal, and the first power supply end is also used as the power supply voltage signal end V1.

In some embodiments, as shown in FIG. 7, the pixel circuit includes a first capacitor Cst1, the first capacitor Cst1 is electrically connected between the gate of the driving transistor M3 and the first power supply end. The capacitance of the first capacitor Cst1 is C1, the capacitance of the second capacitor Cst2 is C2, and $0.8*C1 \leq C2 \leq 1.2*C1$.

In some embodiments, as shown in FIG. 7, the pixel circuit includes a first reset transistor M5, the first reset transistor M5 is electrically connected between the first reset signal end and the gate of the driving transistor M3 for resetting the gate of the driving transistor M3. A gate of the first reset transistor M5 is connected to the scanning line S1N, and the gate of the threshold compensation transistor M4 is connected to the scanning line S2N. The turn-on level on the scanning line S1N at least partially overlaps with the turn-on level on the scanning line S2N in time.

In some embodiments, as shown in FIG. 7, the pixel circuit includes a second reset transistor M7, the second reset transistor M7 is electrically connected between the second reset signal end and the first electrode of the light-emitting element. The second reset signal end is also used as the power voltage signal end V1.

In some embodiments, as shown in FIG. 22, the pixel circuit includes a third reset transistor M8, the third reset transistor M8 is electrically connected between the first reset signal end and the first electrode of the driving transistor M3.

In some embodiments, as shown in FIG. 22, the third reset transistor M8 and the first reset transistor M5 are both N-type transistors, and the gate of the third reset transistor M8 and the gate of the first reset transistor M5 are connected to the same scanning line S1N.

In some embodiments, as shown in FIG. 25, the turn-on level on the scanning line S1N does not overlap with the turn-on level on the scanning line S2N in time.

Figure 26:
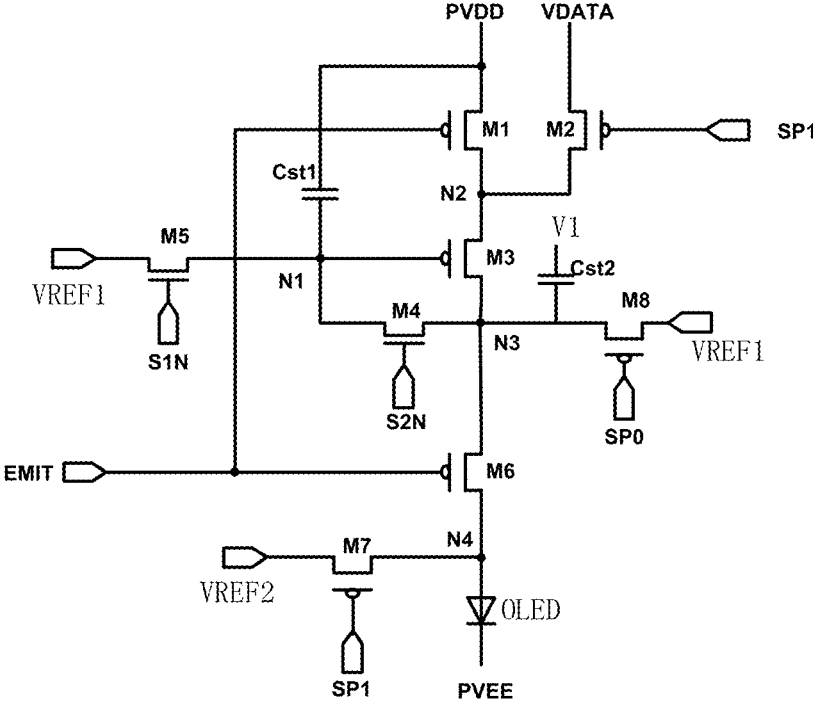
FIG. 26 shows a structural schematic diagram of another equivalent circuit of a pixel circuit in an array substrate according to an embodiment of the present disclosure.

In some embodiments, as shown in FIG. 26, the third reset transistor M8 is a P-type transistor, the first reset transistor M5 is an N-type transistor, and the gate of the third reset transistor M8 and the gate of the first reset transistor M5 are connected to different scanning lines.

Figure 27:
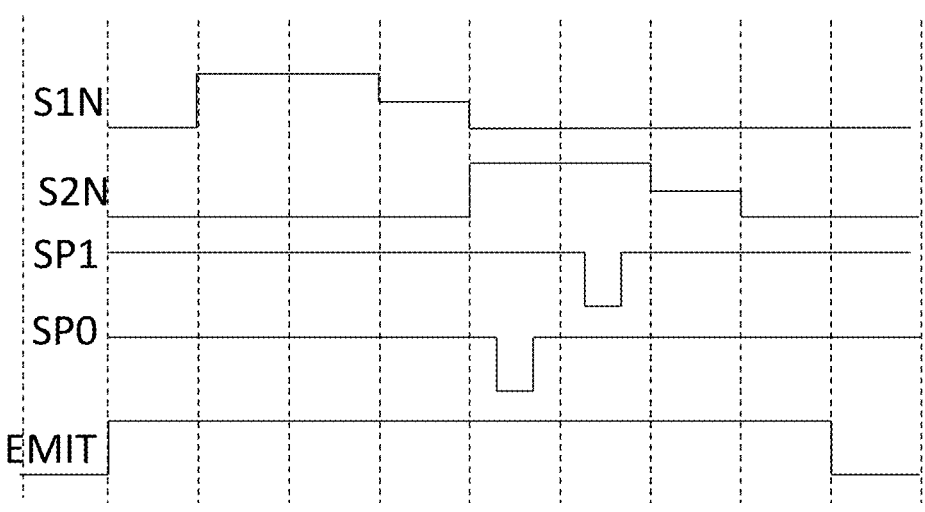
FIG. 27 shows a timing diagram of FIG. 26.

As shown in FIG. 27, the turn-on level on the scanning line S1N may not overlap with the turn-on level on the scanning line S2N in time. The turn-on level on scanning line SP0 is earlier than the turn-on level on scanning line SP1.

It should be noted that the transistors in the embodiments of the present disclosure may be N-type transistors or P-type transistors. For an N-type transistor, the turn-on level is a high level and the cut-off level is a low level. That is, the gate potential of the N-type transistor is at a high level, and the first electrode and the second electrode are turned on; the gate potential of the N-type transistor is at a low level, and the first electrode and the second electrode are cut-off. For a P-type transistor, the turn-on level is a low level and the cut-off level is a high level. That is, the gate potential of a P-type transistor is at a low level, and the first electrode and the second electrode are turned on; the gate potential of the P-type transistor is at a high level, and the first electrode and the second electrode are cut-off. In an implementation, the gates of the transistors mentioned above are configured as control electrodes, and according to the signals and the types of the gates of the transistors, the first electrodes may be configured as the sources and the second electrodes may be configured as the drains, or the first electrodes may be configured as the drains and the second electrodes may be configured as the sources. In addition, the turn-on level and the cut-off level in the embodiments of the present disclosure are general references, the turn-on level refers to any level that can turn on the transistors, and the cut-off level refers to any level that can turn off/cut off the transistors.

Figure 28:
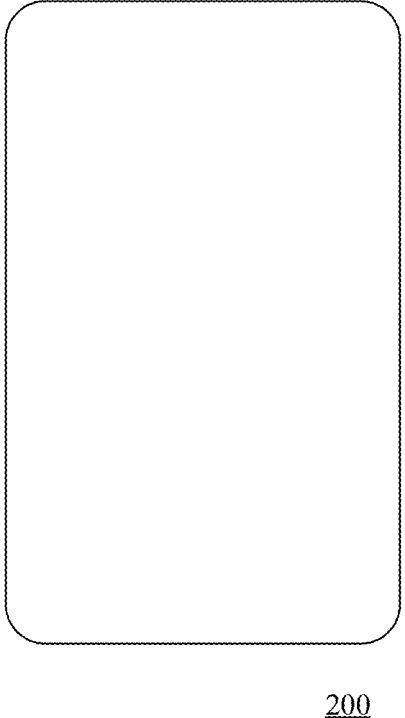
FIG. 28 shows a structural schematic diagram of a display panel according to an embodiment of the present disclosure.

In some embodiments, a display panel is also provided by the present disclosure. FIG. 28 shows a structural schematic diagram of a display panel according to an embodiment of the present disclosure. As shown in FIG. 28, the display panel 200 according to the embodiments of the present disclosure may include the array substrate described in the above embodiments. The display panel shown in FIG. 28 may be an organic light-emitting diode (OLED) display panel.

Embodiments of the present disclosure, the display panel may also be a Micro LED display panel, a quantum dot display panel, etc.

The display panel according to the embodiments of the present disclosure has the beneficial effects of the array substrate according to the embodiments of the present disclosure. For details, reference may be made to the specific description of the array substrate in the above embodiments, which is not repeated in the embodiment.

Figure 29:
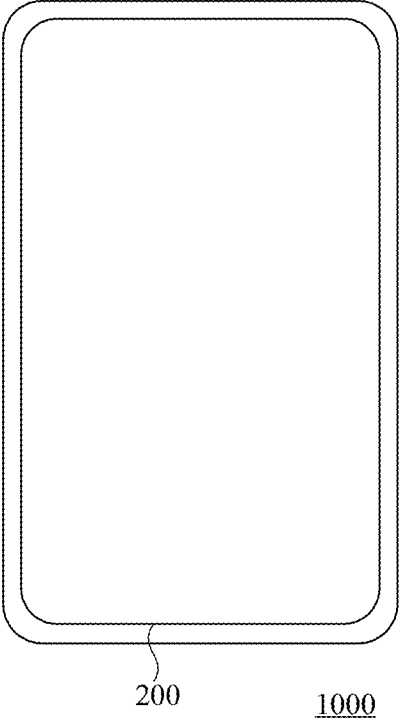
FIG. 29 shows a structural schematic diagram of a display device according to an embodiment of the present disclosure.

A display device is also provided by the present disclosure. The display device includes the display panel described in the present disclosure. Reference is made to FIG. 29, which is a structural schematic diagram of a display device according to an embodiment of the present disclosure. The display device 1000 shown in FIG. 29 includes the display panel 200 described in the above embodiments of the present disclosure. An embodiment in FIG. 29 only takes a mobile phone as an example to illustrate the display device 1000. Understandably, the display device according to the embodiments of the present disclosure may be a wearable product, a computer, a television, a vehicle-mounted display device, and other display device with display functions, which is not limited in the present disclosure. The display device according to the embodiments of the present disclosure has the beneficial effects of the display panel described in the embodiments of the present disclosure. For details, reference may be made to the specific description of the display panel in the above embodiments, which is not repeated in the embodiment.

According to the embodiments described in the present disclosure, the embodiments do not fully describe all details, nor do they limit the present disclosure to only the specific embodiments described. Based on the above description, many modifications and changes can be made. This description selects and specifically describes the embodiments in order to better explain the principles and practical applications of the present disclosure and embodiments of the present disclosure and modifications based on the present disclosure. The present disclosure is only limited by the claims and the full scopes and equivalents.

What is claimed is:

1. An array substrate, comprising:

a substrate;

a pixel circuit arranged on one side of the substrate, wherein the pixel circuit comprises a driving transistor and a threshold compensation transistor, a first electrode of the threshold compensation transistor is connected to a gate of the driving transistor, and a second electrode of the threshold compensation transistor and a first electrode of the driving transistor are both connected to a connection part;

a body part, wherein the body part is electrically connected to a power supply voltage signal end;

wherein an orthographic projection of the connection part on the substrate at least partially overlaps with an orthographic projection of the body part on the substrate;

wherein the pixel circuit further comprises a first reset transistor, a first electrode of the first reset transistor is connected to a first reset signal line, and a second electrode of the first reset transistor is connected to the first electrode of the threshold compensation transistor;

a gate of the first reset transistor is connected to a second scanning line, a gate of the threshold compensation transistor is connected to a third scanning line, the second scanning line provides a second scanning signal, the third scanning line provides a third scanning signal, and a turn-on level of the third scanning signal at least partially overlaps with a turn-on level of the second scanning signal in time.

2. The array substrate according to claim 1, wherein the pixel circuit comprises a first capacitor, a first electrode plate of the first capacitor is connected to the gate of the driving transistor, and a second electrode plate of the first capacitor is connected to a power wire;

at least one of the second electrode plate of the first capacitor and the power wire is the body part.

3. The array substrate according to claim 2, wherein the connection part comprises a first connection part and a second connection part, the first connection part is connected to the first electrode of the driving transistor and the second connection part, and the second connection part is connected to the first electrode of the threshold compensation transistor;

the first connection part and the first electrode of the driving transistor are arranged in a same film layer, and the first connection part and the second connection part are arranged in different film layers.

4. The array substrate according to claim 3, wherein a length of the first connection part in a first direction is greater than or equal to a length of the second connection part in the first direction; or the first connection part is connected to the second connection part via a first through hole, the second connection part is connected to the first electrode of the threshold compensation transistor via a second through hole, and in the first direction, a distance between the first through hole and the first electrode of the driving transistor is greater than a distance between the first through hole and the second through hole.

5. The array substrate according to claim 3, further comprising a branch part, wherein the branch part is connected to the body part, and an orthogonal projection of the branch part on the substrate at least partially overlaps with the orthogonal projection of the connection part on the substrate.

6. The array substrate according to claim 5, wherein the branch part comprises a first branch part, the first branch part is connected to the second electrode plate of the first capacitor, and an orthogonal projection of the first branch part on the substrate overlaps with an orthogonal projection of at least one of the first connection part and the second connection part on the substrate.

7. The array substrate according to claim 6, wherein the first branch part and the second electrode plate of the first capacitor are arranged in a same film layer.

8. The array substrate according to claim 5, wherein the branch part comprises a second branch part, the second branch part is electrically connected to a second electrode of the driving transistor, and an orthogonal projection of the second branch part on the substrate overlaps with an orthogonal projection of at least one of the first connection part and the second connection part on the substrate.

9. The array substrate according to claim 8, wherein the second branch part is electrically connected to the second electrode of the driving transistor through the power wire.

10. The array substrate according to claim 8, wherein the threshold compensation transistor is an oxide transistor, and the orthogonal projection of the second branch part on the substrate at least partially overlaps with an orthogonal projection of a channel of the threshold compensation transistor on the substrate; and/or, the first reset transistor is connected to the gate of the driving transistor, the first reset transistor is an oxide transistor, and an orthogonal projection of at least one of the second branch part and the power wire on the substrate at least partially overlaps with an orthogonal projection of a channel of the first reset transistor on the substrate.

11. The array substrate according to claim 5, wherein the second connection part extends in a first direction, the first direction intersects with a second direction, and a width of the second connection part in the second direction is greater than a width of the first connection part in the second direction; or, a width of the second connection part in the second direction is greater than a width of the power wire in the second direction; or, a width of the second connection part in the second direction is greater than a width of a data line in the second direction.

12. The array substrate according to claim 1, wherein the pixel circuit further comprises a data writing transistor, a first electrode of the first reset transistor is connected to a first reset signal line, a second electrode of the first reset transistor is connected to the first electrode of the threshold compensation transistor through a third connection part, a first electrode of the data writing transistor is connected to a data line, and a second electrode of the data writing transistor is connected to a second electrode of the driving transistor;

the data writing transistor is a P-type transistor, and the first reset transistor and the threshold compensation transistor are N-type transistors;

a gate of the data writing transistor is connected to a first scanning line, the first scanning line comprises a third branch part, an orthogonal projection of the third branch part on the substrate at least partially overlaps with an orthogonal projection of the third connection part on the substrate.

13. The array substrate according to claim 1, wherein the pixel circuit further comprises a third reset transistor, wherein a first electrode of the first reset transistor is connected to a first reset signal line, a second electrode of the first reset transistor is connected to the gate of the driving transistor, a first electrode of the third reset transistor is connected to the first reset signal line, and a second electrode of the third reset transistor is connected to the first electrode of the driving transistor.

14. The array substrate according to claim 13, wherein a gate of the first reset transistor and a gate of the third reset transistor are connected to a same second scanning line, a gate of the threshold compensation transistor is connected to a third scanning line, the second scanning line provides a second scanning signal, the third scanning line provides a third scanning signal, and a turn-on level of the third scanning signal at least partially overlaps or does not overlap with a turn-on level of the second scanning signal in time.

15. The array substrate according to claim 1, wherein the pixel circuit comprises a first capacitor and a second capacitor, the first capacitor is connected to the gate of the driving transistor, the second capacitor is connected to the first electrode of the driving transistor, a capacitance value of the first capacitor is C1, a capacitance value of the second capacitor is C2, and $0.8 \times C1 \leq C2 \leq 1.2 \times C1$.

16. An array substrate, comprising a substrate;

a pixel circuit arranged on one side of the substrate, wherein the pixel circuit comprises a driving transistor and a threshold compensation transistor, a first electrode of the threshold compensation transistor is connected to a gate of the driving transistor, and a second electrode of the threshold compensation transistor and a first electrode of the driving transistor are both connected to a connection part;

a body part, wherein the body part is electrically connected to a power supply voltage signal end;

wherein an orthographic projection of the connection part on the substrate at least partially overlaps with an orthographic projection of the body part on the substrate;

wherein the pixel circuit further comprises a second reset transistor, a first electrode of the second reset transistor is connected to a second reset signal line, and a second electrode of the second reset transistor is connected to a first electrode of a light-emitting element, the second reset signal line comprises a fourth branch part, and an orthogonal projection of the fourth branch part on the substrate at least partially overlaps with an orthogonal projection of the connection part on the substrate, wherein the fourth branch part is connected to two adjacent second reset signal lines.

17. The array substrate according to claim 16, wherein the threshold compensation transistor is an oxide transistor, and the orthogonal projection of the fourth branch part on the substrate at least partially overlaps with an orthogonal projection of a channel of the threshold compensation transistor on the substrate.

18. A display panel, comprising an array substrate, the array substrate comprising:

a substrate;

a pixel circuit arranged on one side of the substrate, wherein the pixel circuit comprises a driving transistor and a threshold compensation transistor, a first electrode of the threshold compensation transistor is connected to a gate of the driving transistor, and a second electrode of the threshold compensation transistor and a first electrode of the driving transistor are both connected to a connection part;

a body part, wherein the body part is electrically connected to a power supply voltage signal end;

wherein an orthographic projection of the connection part on the substrate at least partially overlaps with an orthographic projection of the body part on the substrate;

wherein the pixel circuit further comprises a first reset transistor, a first electrode of the first reset transistor is connected to a first reset signal line, and a second electrode of the first reset transistor is connected to the first electrode of the threshold compensation transistor;

a gate of the first reset transistor is connected to a second scanning line, a gate of the threshold compensation transistor is connected to a third scanning line, the second scanning line provides a second scanning signal, the third scanning line provides a third scanning signal, and a turn-on level of the third scanning signal at least partially overlaps with a turn-on level of the second scanning signal in time.

19. A display device, comprising a display panel, the display panel comprising an array substrate, and the array substrate comprising:

a substrate;

a pixel circuit arranged on one side of the substrate, wherein the pixel circuit comprises a driving transistor and a threshold compensation transistor, a first electrode of the threshold compensation transistor is connected to a gate of the driving transistor, and a second electrode of the threshold compensation transistor and a first electrode of the driving transistor are both connected to a connection part;

a body part, wherein the body part is electrically connected to a power supply voltage signal end;

wherein an orthographic projection of the connection part on the substrate at least partially overlaps with an orthographic projection of the body part on the substrate;

wherein the pixel circuit further comprises a first reset transistor, a first electrode of the first reset transistor is connected to a first reset signal line, and a second electrode of the first reset transistor is connected to the first electrode of the threshold compensation transistor;

a gate of the first reset transistor is connected to a second scanning line, a gate of the threshold compensation transistor is connected to a third scanning line, the second scanning line provides a second scanning signal, the third scanning line provides a third scanning signal, and a turn-on level of the third scanning signal at least partially overlaps with a turn-on level of the second scanning signal in time.

* * * * *